（12） United States Patent
Min et al.

(10) Patent No.: US 12,316,732 B2
(45) Date of Patent: May 27, 2025

(54) CLOCK EDGE CORRECTING DEVICE AND OPERATING METHOD THEREOF

(71) Applicant: Samsung Electronics Co., Ltd., Suwon-si (KR)

(72) Inventors: Kyunghwan Min, Suwon-si (KR); Sangho Kim, Suwon-si (KR); Soomin Lee, Suwon-si (KR); Sodam Ju, Suwon-si (KR); Jahoon Jin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 76 days.

(21) Appl. No.: 18/472,796

(22) Filed: Sep. 22, 2023

(65) Prior Publication Data

US 2024/0267197 A1 Aug. 8, 2024

(30) Foreign Application Priority Data

Feb. 7, 2023 (KR) ........................ 10-2023-0016265

(51) Int. Cl.
*H03D 3/24* (2006.01)
*H04L 7/00* (2006.01)
*H04L 7/033* (2006.01)

(52) U.S. Cl.
CPC .......... *H04L 7/0337* (2013.01); *H04L 7/0091* (2013.01)

(58) Field of Classification Search
CPC ... H04L 7/0337; H04L 7/0091; H03K 5/1565; H03K 5/01; G11C 7/22; G11C 8/18; H03L 7/085; H03L 7/07
USPC ................................ 375/373, 375, 376, 371
See application file for complete search history.

(56) References Cited

U.S. PATENT DOCUMENTS

| | | | |
|---|---|---|---|
| 7,840,831 | B2 | 11/2010 | Jang |
| 8,169,247 | B2 | 5/2012 | Nedachi |
| 9,225,324 | B2 | 12/2015 | Arcudia et al. |
| 9,628,258 | B2 | 4/2017 | Im et al. |
| 9,912,324 | B2 | 3/2018 | Coteus et al. |
| 10,374,588 | B2 | 8/2019 | Huang et al. |
| 10,680,592 | B2 | 6/2020 | Zhao et al. |
| 11,228,416 | B1 | 1/2022 | Huss et al. |
| 11,233,627 | B2 | 1/2022 | Huang et al. |
| 11,258,436 | B1 | 2/2022 | Lin |
| 11,356,304 | B1 | 6/2022 | Fortin et al. |
| 2009/0322388 | A1* | 12/2009 | Fiedler ..................... H03L 7/07 327/155 |
| 2019/0198075 | A1* | 6/2019 | Lee .......................... G11C 8/18 |

(Continued)

OTHER PUBLICATIONS

Kim, et al. "8.1 A 224Gb/s DAC-Based PAM-4 Transmitter with 8-Tap FFE in 10nm CMOS," IEEE International Solid-State Circuits Confrence (ISSCC), pp. 1-4 (2021).

*Primary Examiner* — Phuong Phu
(74) *Attorney, Agent, or Firm* — Harness, Dickey & Pierce, P.L.C.

(57) ABSTRACT

Provided is a method of correcting a clock, the method including receiving a first clock, a second clock, a third clock, and a fourth clock, correcting each of a second rising edge of the second clock, a third rising edge of the third clock, and a fourth rising edge of the fourth clock based on a first rising edge of the first clock, and correcting each of a first falling edge of the first clock, a second falling edge of the second clock, a third falling edge of the third clock, and a fourth falling edge of the fourth clock based on a first rising edge of the first clock.

20 Claims, 24 Drawing Sheets

(56) References Cited

U.S. PATENT DOCUMENTS

| | | | | |
|---|---|---|---|---|
| 2020/0336148 | A1* | 10/2020 | Im | H03L 7/085 |
| 2023/0368855 | A1* | 11/2023 | Kim | G11C 7/22 |
| 2023/0403000 | A1* | 12/2023 | Jeong | H03K 5/01 |
| 2024/0146498 | A1* | 5/2024 | Moon | H03K 5/1565 |

* cited by examiner

CLOCK EDGE CORRECTING DEVICE AND OPERATING METHOD THEREOF

CROSS-REFERENCE TO RELATED APPLICATION

This application is based on and claims priority under 35 U.S.C. § 119 to Korean Patent Application No. 10-2023-0016265, filed on Feb. 7, 2023, in the Korean Intellectual Property Office, the disclosure of which is incorporated by reference herein in its entirety.

BACKGROUND

Various example embodiments relate to a clock edge correcting device, and more particularly, to a device for correcting an edge of a clock signal and/or an operating method thereof.

Devices may use clock signals with various phases to transmit and receive data at high speed. For example, a device may transmit and receive data at high speed using clock signal having four phases of 0°, 90°, 180°, and 270° relative to one another. There is a demand or a desire for a method of generating and correcting a clock signal having a plurality of phases to transmit and receive data at high speed.

SUMMARY

Various example embodiments provide a method of generating and correcting a clock signal having a plurality of phases to transmit and receive data at high speed.

According to some example embodiments, there is provided a method of correcting a clock, the method including receiving a first clock, a second clock, a third clock, and a fourth clock, detecting an error of each of a second rising edge of the second clock, a third rising edge of the third clock, and a fourth rising edge of the fourth clock, each of the detecting based on a first rising edge of the first clock, correcting each of the second rising edge, the third rising edge, and the fourth rising edge based on a respective error of each of the second rising edge, the third rising edge, and the fourth rising edge, detecting an error of each of a first falling edge of the first clock, a second falling edge of the second clock, a third falling edge of the third clock, and a fourth falling edge of the fourth clock, the detecting based on the first rising edge, correcting each of the first falling edge, the second falling edge, the third falling edge, and the fourth falling edge based on a respective error of each of the first falling edge, the second falling edge, the third falling edge, and the fourth falling edge, and transmitting the first clock based on the correction of the first falling edge, the second clock based on the correction of the second rising edge and the second falling edge, the third clock based on the correction of the third rising edge and the third falling edge, and the fourth clock based on the correction of the fourth rising edge and the fourth falling edge. The first clock based on the correction of the first rising edge, the second clock based on the correction of the second rising edge and the second falling edge, the third clock based on the correction of the third rising edge and the third falling edge, and the fourth clock based on the correction of the fourth rising edge and the fourth falling edge are quadrature with each other.

Alternatively or additionally according to various example embodiments, there is provided a method of correcting a clock, the method including receiving a first clock, a second clock, a third clock, and a fourth clock, adjusting a phase of a second rising edge of the second clock based on a first rising edge of the first clock and on a third rising edge of the third clock, adjusting a phase of a fourth rising edge of the fourth clock based on the first rising edge and on the third rising edge after adjusting the phase of the second rising edge, adjusting a phase of the third rising edge based on the adjusted second rising edge and on the adjusted fourth rising edge after the phase adjustment of the fourth rising edge, adjusting a phase of a first falling edge of the first clock based on the first rising edge, adjusting a phase of a second falling edge of the second clock based on the first rising edge, adjusting a phase of a third falling edge of the third clock based on the first rising edge, adjusting a phase of a fourth falling edge of the fourth clock based on the first rising edge, and transmitting the adjusted first clock, the adjusted second clock, the adjusted third clock, and the adjusted fourth clock. The adjusted first clock, the adjusted second clock, the adjusted third clock, and the adjusted fourth clock are quadrature with each other.

Alternatively or additionally according to various example embodiments, there is provided a clock correction circuit including an edge corrector circuit configured to receive a first clock, a second clock, a third clock, and a fourth clock, a rising edge error detector circuit configured to detect errors of a second rising edge of the second clock, a third rising edge of the third clock, and a fourth rising edge of the fourth clock, each of the detecting based on the first rising edge of the first clock, and a falling edge error detector circuit configured to detect errors of each of the first falling edge of the first clock, the second falling edge of the second clock, the third falling edge of the third clock, and the fourth falling edge of the fourth clock, each of the detecting based on the first rising edge. The edge corrector circuit is configured to correct each of the second rising edge, the third rising edge, and the fourth rising edge based on a respective error of each of the second rising edge, the third rising edge, and the fourth rising edge. The edge corrector circuit is configured to correct each of the first falling edge, the second falling edge, the third falling edge, and the fourth falling edge, each of the correcting based on the error of each of the first falling edge, the second falling edge, the third falling edge, and the fourth falling edge, and to transmit the first clock based on the correction, the second clock based on the correction, the third clock based on the correction, and the fourth clock based on the correction. The edge corrector circuit is configured to transmit the first clock based on the correction, the second clock based on the correction, the third clock based on the correction, and the fourth clock based on the correction. The first clock based on the correction, the second clock based on the correction, the third clock based on the correction, and the fourth clock based on the correction are quadrature with each other.

BRIEF DESCRIPTION OF THE DRAWINGS

Various example embodiments will be more clearly understood from the following detailed description taken in conjunction with the accompanying drawings in which.

DETAILED DESCRIPTION OF VARIOUS EXAMPLE EMBODIMENTS

Hereinafter, various example embodiments will be described in detail with reference to the accompanying drawings.

Figure 1A:
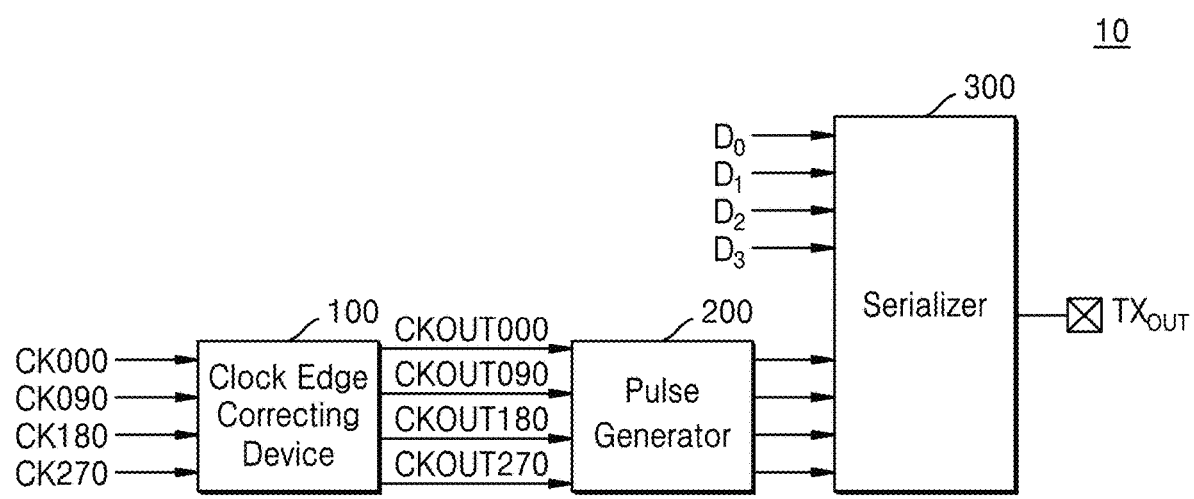
FIG. 1A illustrates a transmitter according to some example embodiments.

FIG. 1A illustrates a transmitter according to some example embodiments.

Referring to FIG. 1A, the transmitter 10 may include a clock edge correcting device 100, a pulse generator 200, and a serializer.

Quadrature-rate transmission (TX) is or includes a data transmission method using a quadrature clock having a frequency of ¼ of the data transmission rate. As described herein, a clock may refer to a clock signal. The quadrature clock may refer to a first clock having a phase of 0°, a second clock having a phase of 90°, a third clock having a phase of 180°, and a fourth clock having a phase of 270°. In FIG. 1A, CK000 may be referred to as a first clock, CK090 may be referred to as a second clock, CK180 may be referred to as a third clock, and CK270 may be referred to as a fourth clock.

Hereinafter, in various example embodiments, CK000 refers to or indicates a first clock having a phase of 0°, CK090 refers to or indicates a second clock having a phase of 90°, CK180 refers to or indicates a third clock having a phase of 180°, and CK270 refers to or indicates a fourth clock having a phase of 270°.

The first clock, the second clock, the third clock, and the fourth clock may have the same period, e.g., the same wavelength and/or frequency. For example, the quadrature clock may include clocks having a phase difference of 90 degrees. In a high-speed wireline interface, the transmitter 10 may transmit data using a quadrature-rate transmission method.

Referring to FIG. 1A, the clock edge correcting device 100 may receive a quadrature clock from an external clock generator. For example, the clock edge correcting device may receive a first clock having a phase of 0°, a second clock having a phase of 90°, a third clock having a phase of 180°, and a fourth clock having a phase of 270°. Alternatively or additionally in some example embodiments 1A, the clock edge correcting device 100 may include a clock generator and generate a quadrature clock using the clock generator. A rising edge and a falling edge of each of the first clock, the second clock, the third clock, and the fourth clock may have a phase error.

The clock edge correcting device 100 according to some example embodiments may detect errors of a second rising edge of a second clock, a third rising edge of a third clock, and a fourth rising edge of a fourth clock, respectively, based on the first rising edge of the first clock. As an example, the clock edge correcting device 100 may detect a first phase difference between the phase of the second rising edge and a first phase, a second phase difference between the phase of the third rising edge and a second phase, and a third phase difference between the phase of the fourth rising edge a third phase. Here, the first phase is or corresponds to a phase that is 90 degrees behind the phase of the first rising edge, the second phase is a phase that is 180 degrees behind the phase of the first rising edge, and the third phase is a phase that is 270 degrees behind the phase of the first rising edge. In some examples, the clock edge correcting device 100 may adjust the phase of the second rising edge to a first middle point between the phase of the first rising edge and the phase of the third rising edge. The clock edge correcting device 100 may adjust the phase of the fourth rising edge to a second middle point between the phase of the first rising edge and the phase of the third rising edge. The clock edge correcting device 100 may adjust the phase of the third rising edge to a middle point between the adjusted phase of the second rising edge and the adjusted phase of the fourth rising edge. The clock edge correcting device 100 may correct or at least partly correct rising edges to an ideal phase by repeating the above adjustments a certain number of times, e.g., five, ten, 15, 20, 25, or 30 times. The clock edge correcting device 100 may detect the first phase difference, the second phase difference, and the third phase difference based on the repetition. To allow the clock edge correcting device 100 to repeat the first adjustment operation, the second adjustment operation, and the third adjustment operation, a fourth phase difference between the phase of the adjusted second rising edge and the first phase, a fifth phase difference between the phase of the adjusted third rising edge and the second phase, a sixth phase difference between the phase of the adjusted fourth rising edge and the third phase may decrease, e.g. may decrease linearly and/or monotonically and/or concavely and/or convexly. Each of the first phase difference, the second phase difference, and the third phase difference may be or may correspond to a digital code acquired by the clock edge correcting device 100 from the first clock, the second clock, the third clock, and the fourth clock using a NOT gate, an AND gate and/or a NAND gate, a comparator, and an accumulator.

The clock edge correcting device 100 may correct each of the second rising edge, the third rising edge, and the fourth rising edge based on the error of each of the second rising edge, the third rising edge, and the fourth rising edge. For example, the clock edge correcting device 100 may correct the phase of the second rising edge to a phase that is 90 degrees behind the phase of the first rising edge based on the first phase difference. The clock edge correcting device 100 may correct the phase of the third rising edge to be 180 degrees behind the phase of the first rising edge based on the second phase difference. The clock edge correcting device 100 may correct the phase of the third rising edge to be 270 degrees behind the phase of the first rising edge based on the second phase difference.

The clock edge correcting device 100 may detect each error of the first falling edge of the first clock, the second falling edge of the second clock, the third falling edge of the third clock, and the fourth falling edge of the fourth clock, each based on the first rising edge. As an example, the clock edge correcting device 100 may detect a seventh phase difference between the phase of the first falling edge and the second phase, an eighth phase difference between the phase of the second falling edge and the third phase, a ninth phase difference between the phase of the third falling edge and the phase of the first rising edge, and a tenth phase difference between the phase of the fourth falling edge and the first phase. Here, the first phase is a phase that is 90 degrees behind the phase of the first rising edge, the second phase is a phase that is 180 degrees behind the phase of the first rising edge, and the third phase is a phase that is 270 degrees behind the phase of the first rising edge. Alternatively or additionally, in the clock edge correcting device 100, the operation of detecting an error on the falling edges may adjust the phase of the fourth falling edge to a first middle point between the phase of the first rising edge and the phase of the first falling edge. The clock edge correcting device 100 may adjust the phase of the second falling edge to a second middle point between the phase of the first rising edge and the phase of the first falling edge. The clock edge correcting device 100 may adjust the phase of the first falling edge to a middle point between the adjusted phase of the fourth falling edge and the adjusted phase of the second falling edge. The clock edge correcting device 100 may repeat the above adjustments. The clock edge correcting device 100 may detect the ninth phase difference using a phase detector. The clock edge correcting device 100 may detect the seventh phase difference, the eighth phase difference, and the tenth phase difference based on the repetition.

The clock edge correcting device 100 may correct each of the first falling edge, the second falling edge, the third falling edge, and the fourth falling edge based on the phase errors of each of the first falling edge, the second falling edge, the third falling edge, and the fourth falling edge. The clock edge correcting device 100 may correct the phase of the first falling edge to be 180 degrees behind the phase of the first rising edge based on the seventh phase difference. The clock edge correcting device 100 may correct the phase of the second falling edge to be 270 degrees behind the phase of the first rising edge based on the eighth phase difference. The clock edge correcting device 100 may correct the phase of the third falling edge to the phase of the first rising edge based on the ninth phase difference. The clock edge correcting device 100 may correct the phase of the fourth falling edge to be 90 degrees behind the phase of the first rising edge based on the tenth phase difference.

The above-mentioned corrections of rising edges and correct of falling edges may not affect each other and may be independent of each other. A duty-cycle of each of the first clock based on the correction, the second clock based on the correction, the third clock based on the correction, and the fourth clock based on the correction may be 50%. The duty-cycle may indicate a ratio of an amount of time occupied by a logic high in a signal period versus an amount of time occupied by a logic low in the signal period. The clock edge correcting device 100 according to some example embodiments may control the duty-cycle by correcting the edge.

The clock edge correcting device 100 may transmit the corrected first clock, the corrected second clock, the corrected third clock, and the corrected third clock to the pulse generator 200.

The clock edge correcting device 100 according to some example embodiments may include an edge corrector circuit for receiving the first clock, the second clock, the third clock, and the fourth clock, a rising edge error detector circuit for detecting errors of the second rising edge of the second clock, the third rising edge of the third clock, and the fourth rising edge of the fourth clock, respectively, based on the first rising edge of the first clock, and a falling edge error detector circuit for detecting errors of each of the first falling edge of the first clock, the second falling edge of the second clock, the third falling edge of the third clock, and the fourth falling edge of the fourth clock based on the first rising edge.

The edge corrector circuit may correct each of the second rising edge, the third rising edge, and the fourth rising edge based on the error of each of the second rising edge, the third rising edge, and the fourth rising edge. The edge corrector circuit may correct each of the first falling edge, the second falling edge, the third falling edge, and the fourth falling edge based on the error of each of the first falling edge, the second falling edge, the third falling edge, and the fourth falling edge. The edge corrector circuit may be configured to transmit the first clock based on the correction, the second clock based on the correction, the third clock based on the correction, and the fourth clock based on the correction. The first clock based on the correction, the second clock based on the correction, the third clock based on the correction, and the fourth clock based on the correction may be quadrature with each other.

The pulse generator 200 may generate a selection pulse using the first clock, second clock, third clock, and fourth clock received from the clock edge correcting device 100. The pulse generator 200 may transmit the generated selection pulse to the serializer 300. The serializer 300 may receive data D0, D1, D2, and D3. In some example embodiments, the serializer 300 may receive a selection pulse from the pulse generator 200. The serializer 300 may output the data D0, D1, D2, and D3 based on the timing of the selection pulse. According to some example embodiments, the serializer may be or include, or be included in a 4:1 serializer. The 4:1 serializer 300 may sequentially transmit data D0, D1, D2, and D3 in a section where the selection pulse is 1. Accordingly, the transmitter 10 may transmit the data D0, D1, D2, and D3 based on a data-rate 4 times the frequency of the quadrature clock.

As described above, the clock edge correcting device 100 according to various example embodiments may independently control a rising edge and a falling edge of a clock. The clock edge correcting device 100 according to some example embodiments may correct an error of a quadrature clock by independently controlling a rising edge and a falling edge of a clock. The clock edge correcting device 100 according to some example embodiments may reduce jitter by independently controlling a rising edge and a falling edge of a clock.

The transmitter 10 according to various example embodiments may transmit data at high speed by independently controlling the rising edge and falling edge of a clock. The transmitter 10 according to some example embodiments may improve eye-opening of an output by independently controlling the rising edge and falling edge of a clock.

Figure 1B:
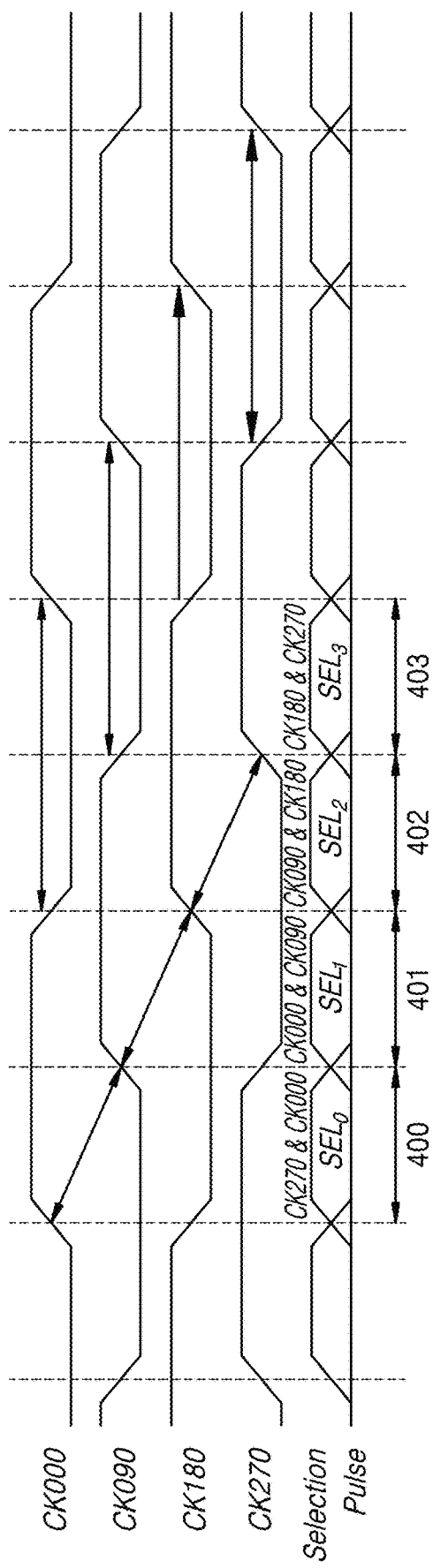
FIG. 1B illustrates timing of a quadrature clock corrected by a clock edge correcting device and timing of a selection pulse according to some example embodiments.

FIG. 1B illustrates timing of a quadrature clock corrected by a clock edge correcting device and selection pulse timing according to some example embodiments. FIG. 1B may be described with reference to FIG. 1A, and redundant description may be omitted.

Referring to FIG. 1B, the first clock CK000 has a phase of 0 degree. The second clock CK090 has a phase of 90 degrees. The third clock CK180 has a phase of 180 degrees. The fourth clock CK270 has a phase of 270 degrees.

The pulse generator 200 may generate selection pulses SEL0, SEL1, SEL2, and SEL3 based on the first clock, second clock, third clock, and fourth clock that are received from the clock edge correcting device 100.

For example, the pulse generator 200 may generate a selection pulse SEL0 in the first section 400 based on the rising edge of the first clock and the falling edge of the fourth clock. Alternatively or additionally, the pulse generator 200 may generate the second section 401 selection pulse SEL1 based on the rising edge of the second clock and on the falling edge of the first clock. Alternatively or additionally, the pulse generator 200 may generate the third section 402 selection pulse SEL2 based on the rising edge of the third clock and on the falling edge of the second clock. Alternatively or additionally, the pulse generator 200 may generate the selection pulse SEL3 in the fourth section 403 based on the rising edge of the fourth clock and on the falling edge of the third clock.

The selection pulses SEL0, SEL1, SEL2, and SEL3 may have a respective pulse width corresponding to a phase difference between the first clock, the second clock, the third clock, and the fourth clock corrected by the correcting device 100.

The pulse generator 200 may transmit 4-bit codes of the generated selection pulses SEL0, SEL1, SEL2, and SEL3 to the serializer 300.

Figure 1C:
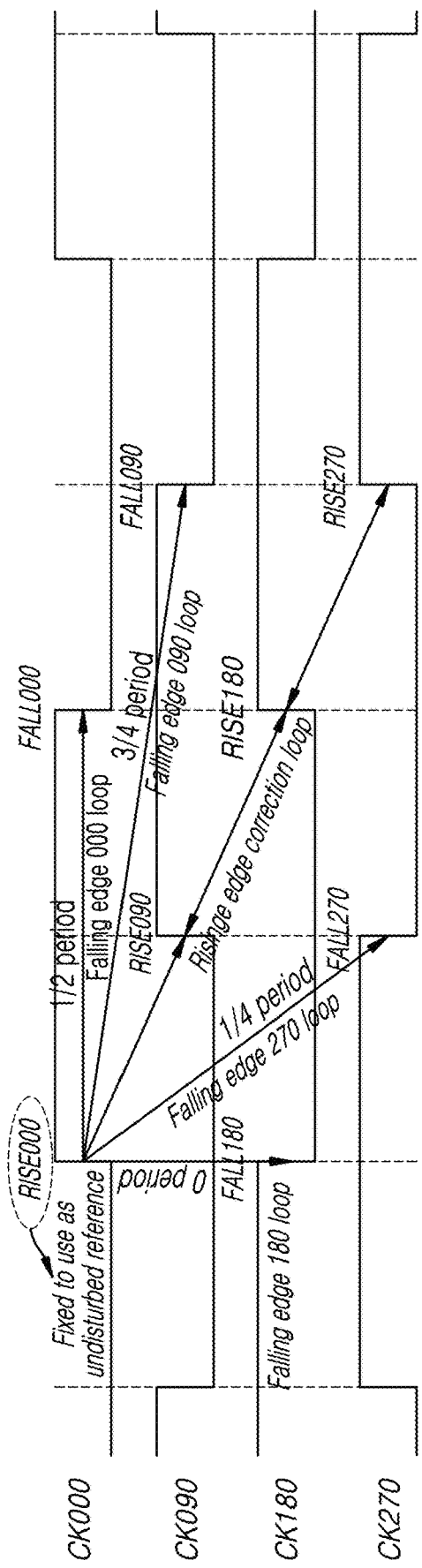
FIG. 1C illustrates a correct loop of quadrature clocks according to some example embodiments.

FIG. 1C illustrates a clock correction timing diagram according to some example embodiments. FIG. 1C may be described with reference to FIGS. 1A and 1B, and overlapping descriptions may be omitted.

Referring to FIG. 1C, the rising edge of the first clock may be indicated by RISE000 and the falling edge by FALL000. The rising edge of the second clock may be indicated by RISE090 and the falling edge by FALL090. The rising edge of the third clock may be indicated by RISE180 and the falling edge by FALL180. The rising edge of the fourth clock may be indicated by RISE270 and the falling edge by FALL270. Hereinafter, in the inventive concept, RISE000, RISE090, RISE180, RISE270, FALL000, FALL090, FALL180, and FALL270 may be used as terms having the above meaning.

The clock edge correcting device 100 may be set based on the rising edge of the first clock.

The clock edge correcting device 100 may correct falling edges using the rising edge of the first clock. For example, the clock edge correcting device 100 may correct the falling edge of the first clock so that the falling edge of the first clock lags behind the rising edge of the first clock by ½ of a period. Alternatively or additionally, the clock edge correcting device 100 may correct the falling edge of the second clock so that the falling edge of the second clock lags behind the rising edge of the first clock by ¾ cycles. Alternatively or additionally, the clock edge correcting device 100 may correct the falling edge of the third clock so that the phase of the rising edge of the first clock and the falling edge of the third clock become the same. Alternatively or additionally, the clock edge correcting device 100 may correct the falling edge of the fourth clock so that the falling edge of the fourth clock lags behind the rising edge of the first clock by ¼ cycle.

The clock edge correcting device 100 may correct other rising edges using the rising edge of the first clock. For example, the clock edge correcting device 100 may correct the rising edge of the second clock so that the rising edge of the second clock lags behind the rising edge of the first clock by 90 degrees. Alternatively or additionally, the clock edge correcting device 100 may correct the rising edge of the third clock so that the rising edge of the third clock lags behind the rising edge of the first clock by 180 degrees. Alternatively or additionally, the clock edge correcting device 100 may correct the rising edge of the fourth clock so that the rising edge of the fourth clock lags behind the rising edge of the first clock by 270 degrees.

Figure 1D:
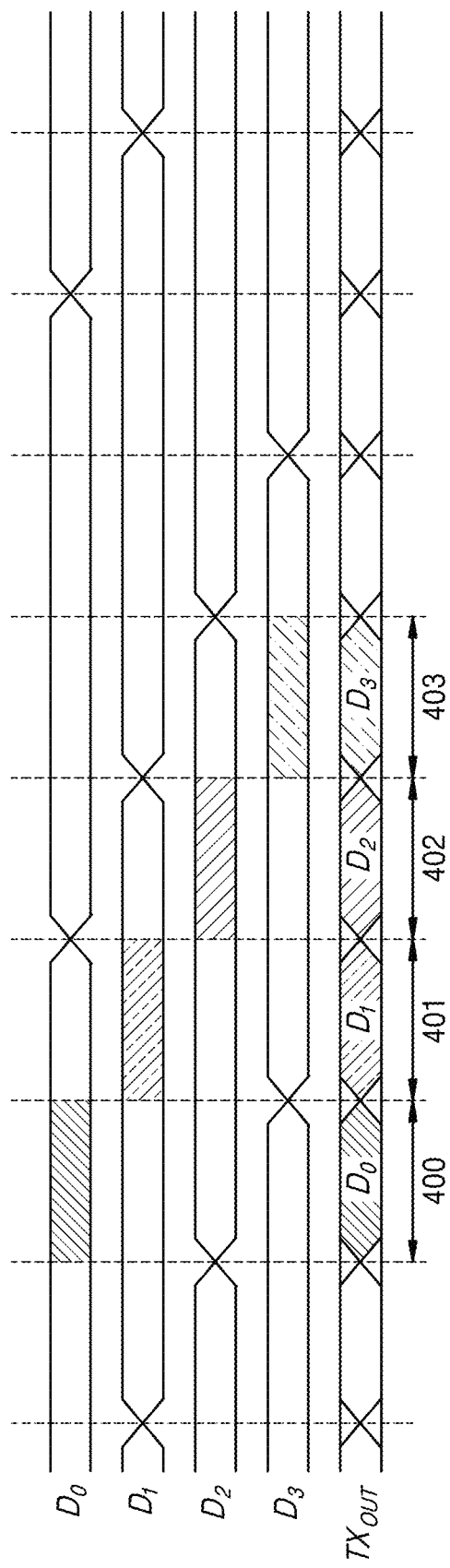
FIG. 1D illustrates timing of transmitted data based on corrected clocks according to embodiments.

FIG. 1D illustrates timing of data transmitted based on clocks corrected by a clock edge correcting device according to various example embodiments. FIG. 1D may be described with reference to FIGS. 1A and 1B, and overlapping descriptions may be omitted.

FIG. 1D may be described with reference to FIGS. 1A and 1B, and overlapping descriptions may be omitted. Specifically, the serializer 300 may transmit the data D0 in the first section 400 using the selection pulse SEL0. The serializer 300 may transmit the data D1 in the second section 401 using the selection pulse SEL1. The serializer 300 may transmit the data D2 in the third section 402 using the selection pulse SEL2. The serializer 300 may transmit the data D3 in the fourth section 403 using the selection pulse SEL3.

Figure 2A:
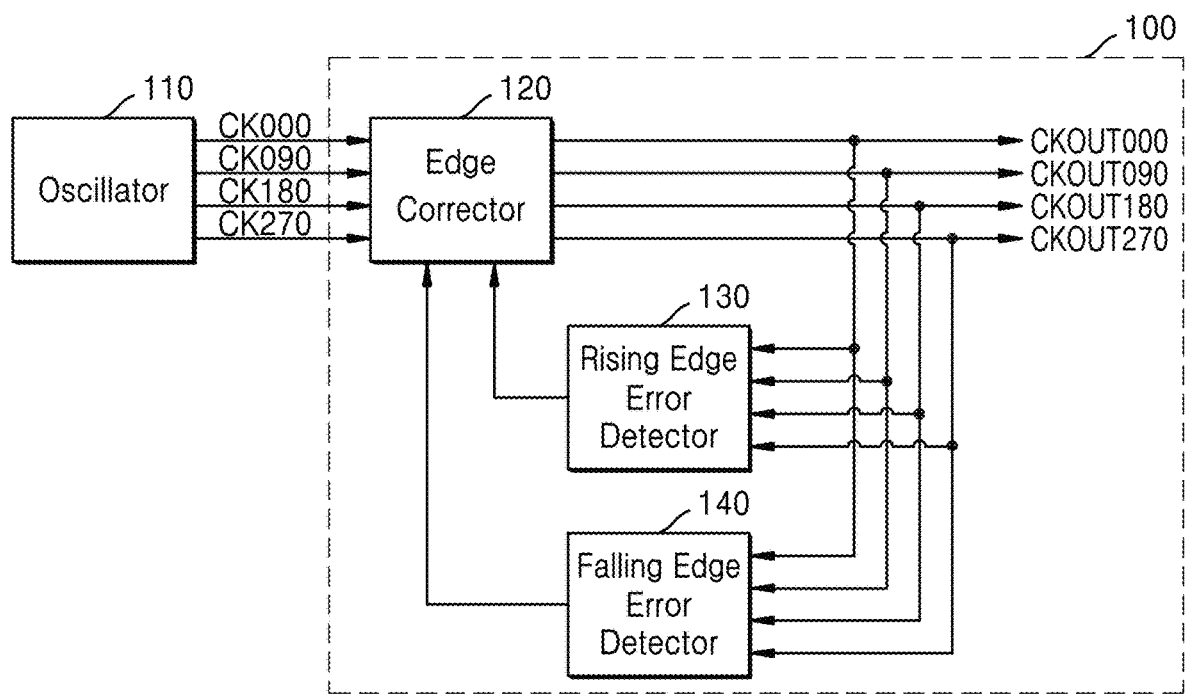
FIG. 2A shows a block diagram of a clock edge correcting device according to some example embodiments.

FIG. 2A shows a block diagram of a clock edge correcting device according to some example embodiments.

Referring to FIG. 2A, the clock edge correcting device 100 includes an oscillator 110, a rising edge error detector 120, and a falling edge error detector, 130. The oscillator 110 may generate a first clock, a second clock, a third clock, and a fourth clock outside the clock edge correcting device 100. The clock edge correcting device 100 may include all or at least part of the oscillator 110 therein, and is not limited to example embodiments described above with reference to FIG. 2A. The oscillator 110 may be or may include a ring oscillator; example embodiments are not limited thereto.

The edge corrector 120 may receive the first clock, the second clock, the third clock, and the fourth clock from the oscillator 110. The edge corrector 120 may correct the phase of the rising edge of the second clock, the third clock, and the fourth clock, respectively, based on the code received from the rising edge error detector 130. The edge corrector 120 may correct the phase of the falling edge of each of the first clock, the second clock, the third clock, and the fourth clock, based on the code received from the falling edge error detector 140.

The rising edge error detector 130 may receive a first clock, a second clock, a third clock, and a fourth clock from the edge corrector 120. The rising edge error detector 130 may transmit a code for correcting the phase of the rising edge of each of the second clock, the third clock, and the fourth clock to the edge corrector 120. The falling edge error detector 140 may transmit codes for correcting phases of falling edges of the first clock, the second clock, the third clock, and the fourth clock to the edge corrector 120.

Figure 2B:
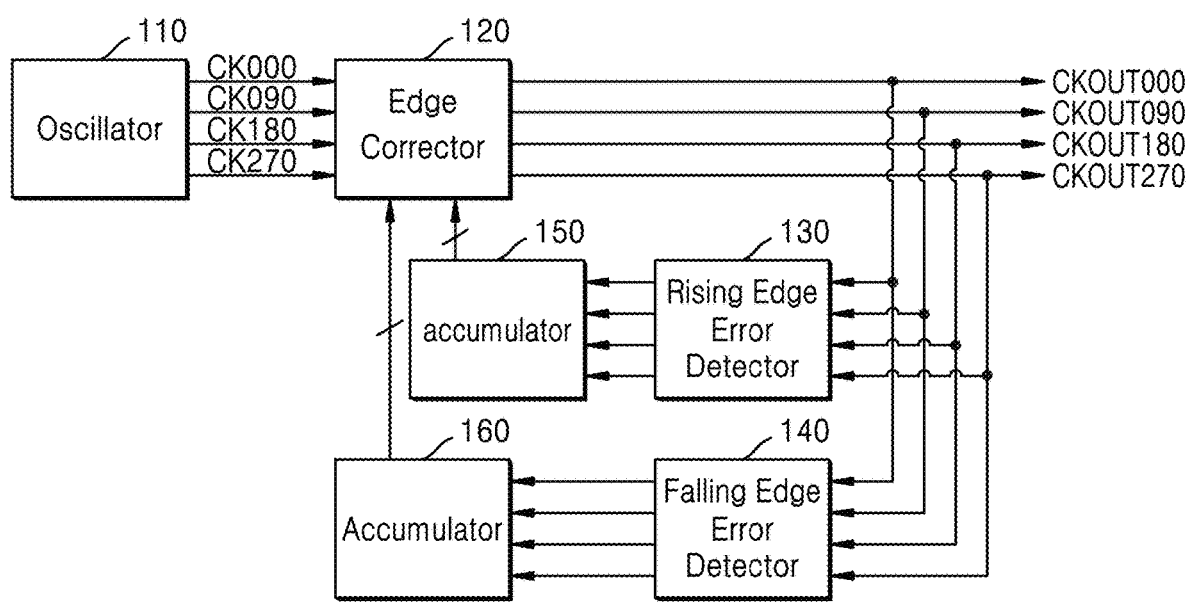
FIG. 2B shows a block diagram of a clock edge correcting device according to some example embodiments.

FIG. 2B shows a block diagram of a clock edge correcting device according to some example embodiments. FIG. 2B may be described with reference to FIG. 1C. Redundant descriptions may be omitted.

Referring to FIG. 2B, the clock edge correcting device 100 may include an oscillator 110, a rising edge error detector 120, a falling edge error detector 130, and accumulators 150 and 160. The oscillator 110 may generate a first clock, a second clock, a third clock, and a fourth clock outside the clock edge correcting device 100.

The edge corrector 120 may receive the first clock, the second clock, the third clock, and the fourth clock from the oscillator 110. The edge corrector 120 may correct phases of rising edges of the second clock, the third clock, and the fourth clock, respectively, based on the code received from the accumulator 150. The edge corrector 120 may correct the phase of the falling edge of each of the first clock, the second clock, the third clock, and the fourth clock based on the code received from the accumulator 160.

The rising edge error detector 130 may receive a first clock, a second clock, a third clock, and a fourth clock from the edge corrector 120. The first clock output by the edge corrector 120 may be indicated as CKOUT000. The second clock output by the edge corrector 120 may be indicated as CKOUT090. The third clock output by the edge corrector 120 may be indicated as CKOUT180. The third clock output by the edge corrector 120 may be indicated as CKOUT270.

The rising edge error detector 130 may determine whether the "rising edge of the second clock" is ahead or behind based on the "phase behind the rising edge of the first clock by 90 degrees". For example, the rising edge error director 130 may determine the precedence of "the phase of RISE090" and "the phase behind RISE000 by 90 degrees". The rising edge error detector 130 may transmit 1-bit information about the order of "the phase of the rising edge of the second clock" and "the phase that is 90 degrees behind the phase of the rising edge of the first clock" to the accumulator 150.

The rising edge error detector 130 may determine whether the "rising edge of the third clock" is ahead or behind based on the "phase behind the rising edge of the first clock by 180 degrees". The rising edge error detector 130 may transmit to the accumulator 150 1-bit information about the order of "the phase of the rising edge of the third clock" and "the phase 180 degrees behind the rising edge of the first clock".

The rising edge error detector 130 may determine whether the "rising edge of the fourth clock" is ahead or behind based on the "phase behind the rising edge of the first clock by 270 degrees". The rising edge error detector 130 may transmit to the accumulator 150 1-bit information about the order of "the phase of the rising edge of the fourth clock" and "the phase 270 degrees behind the rising edge of the first clock".

The accumulator 150 may accumulate information such as single-bit (1-bit) information received from the rising edge error detector 130 for each of the second clock, the third clock, and the fourth clock. The accumulator 150 may transmit codes accumulated for each of the second clock, the third clock, and the fourth clock to the edge corrector 120, respectively.

The falling edge error detector 140 may receive a first clock, a second clock, a third clock, and a fourth clock from the edge corrector 120. The falling edge error detector 140 may determine whether the "phase of the falling edge of the first clock" is ahead or behind based on "the phase behind the rising edge of the first clock by 180 degrees". For example, the falling edge error detector 140 may determine the order of "phase of FALL000" and "phase 180 degrees behind RISE000". The falling edge error detector 140 may transmit 1-bit information about the order of the "phase of the falling edge of the first clock" and "the phase that is 180 degrees behind the phase of the rising edge of the first clock" to the accumulator 160.

The falling edge error detector 140 may determine whether the "phase of the falling edge of the second clock" is ahead or behind based on the "phase behind the rising edge of the first clock by 270 degrees". The falling edge error detector 140 may transmit 2-bit information about the order of the "phase of the falling edge of the second clock" to "the phase that is 270 degrees behind the phase of the rising edge of the first clock" to the accumulator 160.

The falling edge error detector 140 may determine whether the "phase of the falling edge of the third clock" is ahead or behind based on the "phase of the rising edge of the first clock". The falling edge error detector 140 may transmit information such as 1-bit information about the order of the "phase of the falling edge of the third clock" and the "phase of the rising edge of the first clock" to the accumulator 160.

The falling edge error detector 140 may determine whether the "phase of the falling edge of the fourth clock" is ahead or behind based on the "phase behind the rising edge of the first clock by 90 degrees". The falling edge error detector 140 may transmit 1-bit information about the order of the "phase of the falling edge of the fourth clock" and "the phase that is 90 degrees behind the phase of the rising edge of the first clock" to the accumulator 160.

The accumulator 160 may accumulate the 1-bit information received from the falling edge error detector 140 for each of the first clock, the second clock, the third clock, and the fourth clock. The accumulator 160 may transmit codes accumulated for each of the first clock, the second clock, the third clock, and the fourth clock to the edge corrector 120, respectively.

Figure 2C:
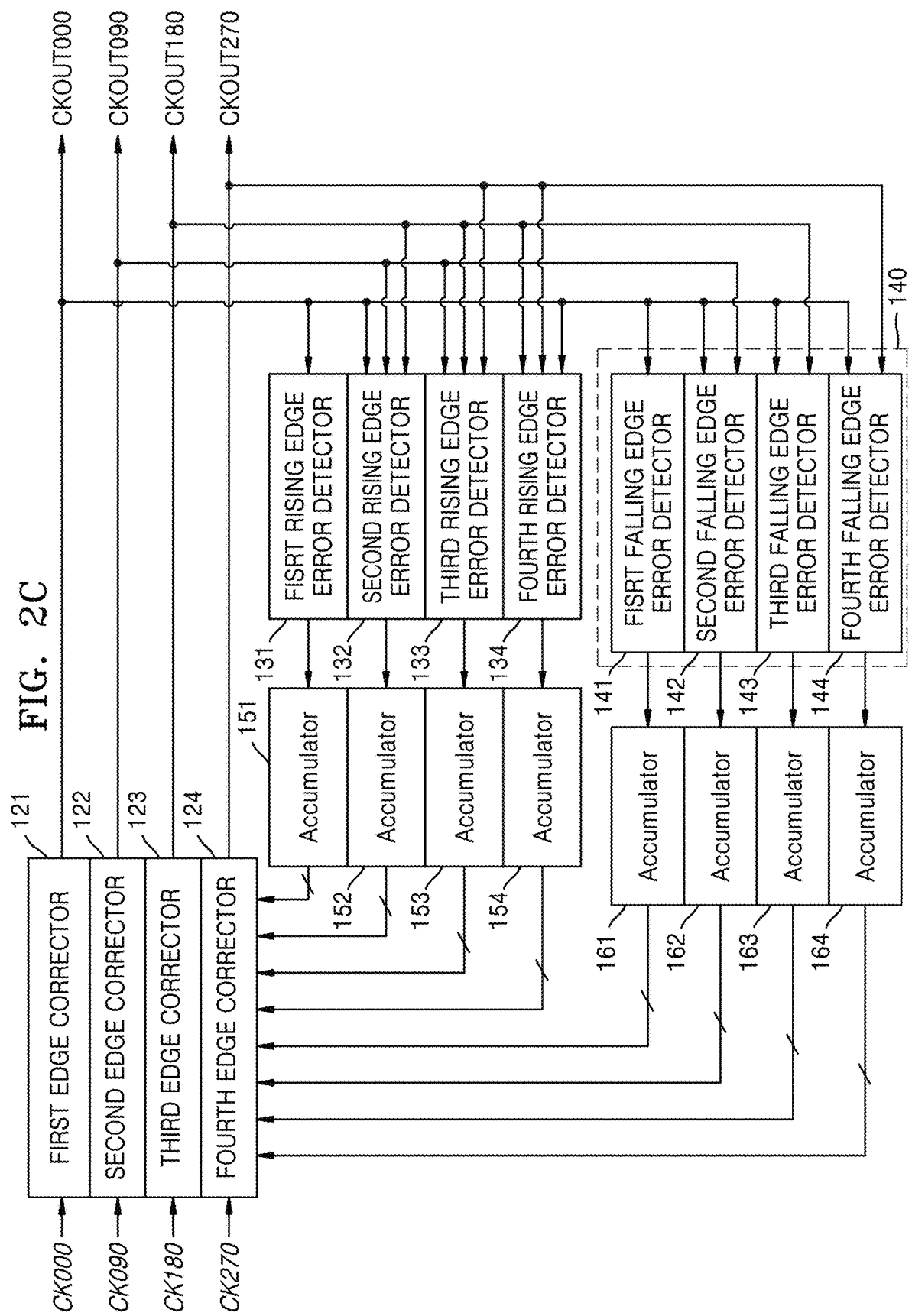
FIG. 2C shows a block diagram of a clock edge correcting device according to some example embodiments.

FIG. 2C is a block diagram of a clock edge correcting device according to some example embodiments. FIG. 2C may be described with reference to FIGS. 1C and 2B, and redundant descriptions may be omitted.

Referring to FIG. 2C, the clock edge correcting device 100 may include edge correctors 121, 122, 123, and 124, rising edge error detectors 131, 132, 133, and 134, accumulators 151, 152, 153, 154, 161, 162, 163, and 164 and falling edge error detectors 141, 142, 143, and 144.

The first edge corrector 121 may receive a first clock from a clock signal generating device. The first edge corrector 121 may receive a code for fixing the phase of the rising edge of the first clock from the accumulator 151. The first edge corrector 121 may fix the phase of the rising edge of the first clock based on the code received from the accumulator 151. The first edge corrector 121 may receive a code for correcting the phase of the falling edge of the first clock from the accumulator 161. For example, the first edge corrector 121 may correct the phase of the falling edge of the first clock to be 180 degrees behind the phase of the rising edge of the first clock. The first edge corrector 121 may correct the phase of the falling edge of the first clock based on the code received from the accumulator 161. The first edge corrector 121 may output a first clock based on a fixed rising edge and a corrected falling edge. The output first clock may be indicated as CKOUT000.

The second edge corrector 122 may receive the second clock from the clock signal generating device. The second edge corrector 122 may receive a code for correcting the phase of the rising edge of the second clock from the accumulator 152. The second edge corrector 122 may correct the phase of the rising edge of the second clock based on the code received from the accumulator 152. For example, the second edge corrector 122 may correct the phase of the rising edge of the second clock to be 90 degrees behind the phase of the rising edge of the first clock. The second edge corrector 122 may receive a code for adjusting the phase of the falling edge of the second clock from the accumulator 162. The second edge corrector 122 may correct the phase of the falling edge of the second clock based on the code received from the accumulator 162. For example, the second edge corrector 122 may correct the phase of the falling edge of the second clock to be 270 degrees behind the phase of the rising edge of the first clock. The second edge corrector 122 may output a second clock based on the corrected rising edge and corrected falling edge. The output second clock may be indicated as CKOUT090.

The third edge corrector 123 may receive a third clock from the clock signal generating device. The third edge corrector 123 may receive a code for correcting the phase of the rising edge of the third clock from the accumulator 153. The third edge corrector 123 may correct the phase of the rising edge of the third clock based on the code received from the accumulator 153. For example, the third edge corrector 123 may correct the phase of the rising edge of the third clock to be 180 degrees behind the phase of the rising edge of the first clock. The third edge corrector 123 may receive a code for adjusting the phase of the falling edge of the third clock from the accumulator 163. The third edge corrector 123 may correct the phase of the falling edge of the third clock based on the code received from the accumulator 163. For example, the third edge corrector 123 may correct the phase of the falling edge of the third clock to the phase of the rising edge of the first clock. The third edge corrector 123 may output a third clock based on the corrected rising edge and corrected falling edge. The output third clock may be displayed as CKOUT180.

The fourth edge corrector 124 may receive a fourth clock from the clock signal generating device. The fourth edge corrector 124 may receive a code for correcting the phase of the rising edge of the fourth clock from the accumulator 154. The fourth edge corrector 124 may correct the phase of the rising edge of the fourth clock based on the code received from the accumulator 154. For example, the fourth edge corrector 124 may correct the phase of the rising edge of the fourth clock to be 270 degrees behind the phase of the rising edge of the first clock. The fourth edge corrector 124 may receive a code for adjusting the phase of the falling edge of the fourth clock from the accumulator 164. The fourth edge corrector 124 may correct the phase of the falling edge of the fourth clock based on the code received from the accumulator 164. For example, the fourth edge corrector 124 may correct the phase of the falling edge of the fourth clock to be 90 degrees behind the phase of the rising edge of the first clock. The fourth edge corrector 124 may output a fourth clock based on the corrected rising edge and corrected falling edge. The output fourth clock may be indicated as CKOUT270.

The first rising edge error detector 131 may receive a first clock. The second rising edge error detector 132 may receive the first clock, the second clock, and the third clock. The third rising edge error detector 133 may receive the second clock, the third clock, and the fourth clock. The fourth rising edge error detector 134 may receive the first clock, the third clock, and the fourth clock.

The second rising edge error detector 132 may transmit 1-bit information about whether the rising edge of the second clock is ahead or behind the target phase to the accumulator 152 based on the received first clock, second clock and third clock. Here, the target phase may be a phase 90 degrees behind the phase of the rising edge of the first clock.

The third rising edge error detector 133 may transmit 1-bit information about whether the rising edge of the third clock is ahead or behind the target phase to the accumulator 153 based on the received second clock, third clock and fourth clock. Here, the target phase may be a phase 180 degrees behind the phase of the rising edge of the first clock.

The fourth rising edge error detector 134 may transmit information such as 1-bit information about whether the rising edge of the fourth clock is ahead or behind the target phase to the accumulator 154 based on the received first clock, third clock and fourth clock. Here, the target phase may be a phase 270 degrees behind the phase of the rising edge of the first clock.

The first falling edge error detector 141 may receive a first clock. The second falling edge error detector 142 may receive the first clock and the second clock. The third falling edge error detector 143 may receive the first clock and the third clock. The fourth falling edge error detector 144 may receive the first clock and the fourth clock.

The first falling edge error detector 141 may transmit information such as 1-bit information about whether the falling edge of the first clock is ahead or behind the target phase based on the received first clock to the accumulator 161. Here, the target phase may be a phase 180 degrees behind the phase of the rising edge of the first clock.

The second falling edge error detector 142 may transmit information such as 1-bit information about whether the falling edge of the second clock is ahead or behind the target phase to the accumulator 162 based on the received first clock and second clock. Here, the target phase may be a phase 270 degrees behind the phase of the rising edge of the first clock.

The third falling edge error detector 143 may transmit information such as 1-bit information about whether the falling edge of the third clock is ahead or behind the target phase to the accumulator 163 based on the received first and third clocks. Here, the target phase may be the same phase as the phase of the rising edge of the first clock.

The fourth falling edge error detector 144 may transmit information such as 1-bit information about whether the falling edge of the fourth clock is ahead or behind the target phase to the accumulator 164 based on the received first and fourth clocks. Here, the target phase may be a phase 90 degrees behind the phase of the rising edge of the first clock.

Unlike or in addition to example embodiments described with reference to FIG. 2C, according to some example embodiments, the falling edge error detectors 141, 142, 143, and 144 may detect a phase error based on three clocks like the rising edge error detectors 131, 132, 133, and 134 of FIG. 2C.

Figure 3A:
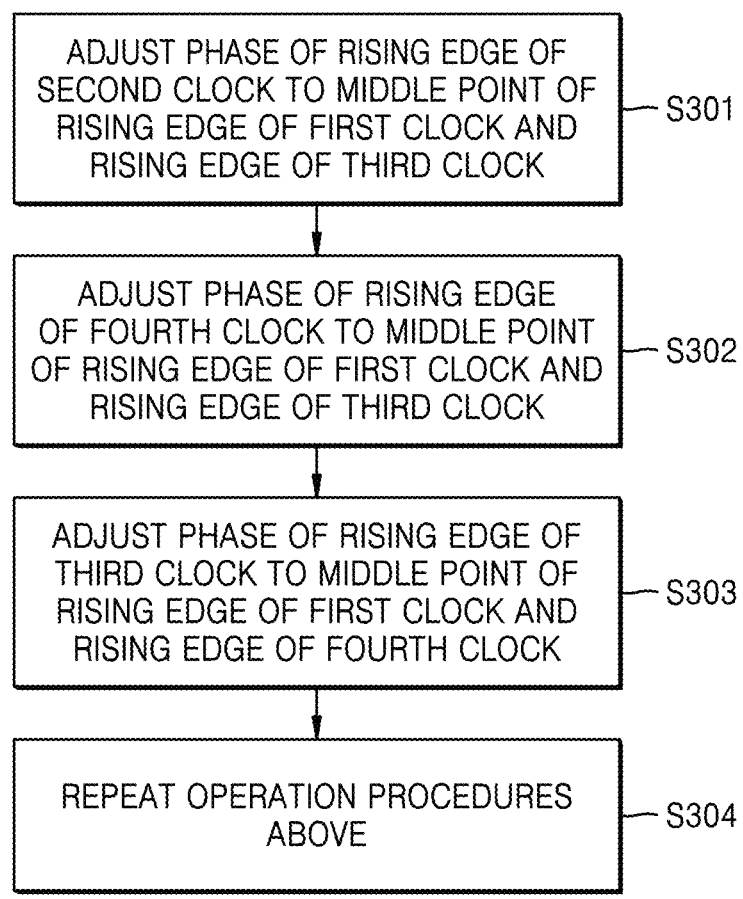
FIG. 3A is a flow chart of a clock edge correction method according to some example embodiments.

FIG. 3A shows a flow chart of a clock edge correct method according to some example embodiments. FIG. 3A may be described with reference to FIGS. 1A, 1B, and 1C.

Referring to FIG. 3A, in operation S301, the clock edge correcting device 100 may adjust the phase of the rising edge of the second clock to the middle point of the rising edge of the first clock and the rising edge of the third clock.

In operation S302, the clock edge correcting device 100 may adjust the phase of the rising edge of the fourth clock to the middle point of the rising edge of the first clock and the rising edge of the third clock.

In operation S303, the clock edge correcting device 100 may adjust the phase of the rising edge of the third clock to the middle point of the rising edge of the first clock and the rising edge of the fourth clock.

In operation S304, the clock edge correcting device 100 may repeat the above operations. The clock edge correcting device 100 repeats the above operations so that the steady-state error may be converged to 0 using the rising edge of the fixed first clock, the rising edge of the second clock, the rising edge of the third clock, and the rising edge of the fourth clock. For example, the clock edge correcting device 100 may correct the rising edges of the second to fourth clocks by using the rising edges of the quadrature clock.

Figure 3B:
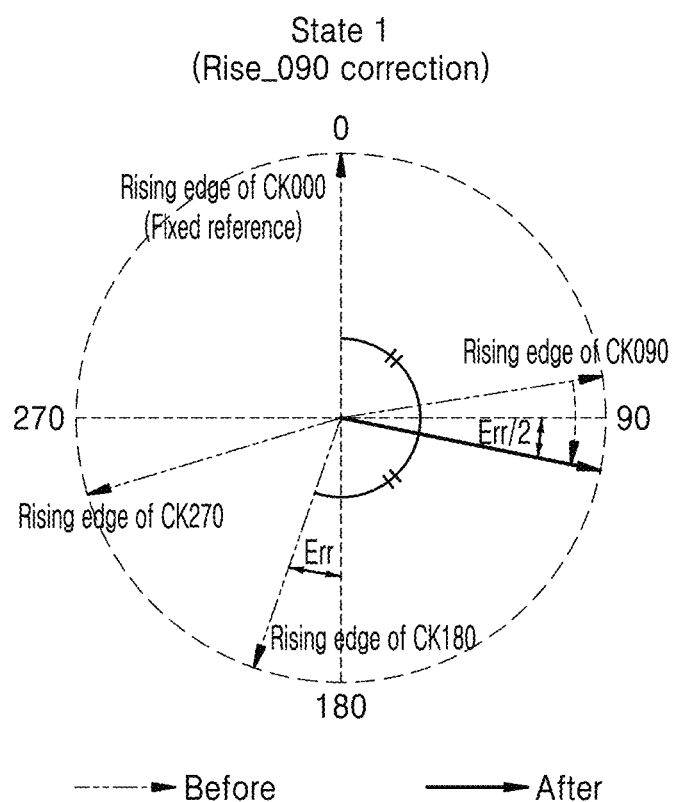
FIG. 3B is a visual representation of the S301 operation of FIG. 3A.

FIG. 3B is a visual representation of operation S301 of FIG. 3A. FIG. 3B may be described with reference to FIG. 3A.

Referring to FIG. 3B, STATE 1 represents an example of a correction of a rising edge of the second clock in an initial state. The rising edge of the third clock may have an error 409 based on a phase 180 degrees behind the phase of the rising edge of the first clock.

The clock edge correcting device 100 may correct the phase of the rising edge of the second clock to the first middle point of the rising edge of the first clock and the rising edge of the third clock. Accordingly, an error Err/2 410 may be generated based on a phase in which the rising edge of the second clock is 90 degrees behind the phase of the rising edge of the first clock. For example, the rising edge of the second clock may be corrected so that the error is reduced compared to the rising edge of the third clock.

Figure 3C:
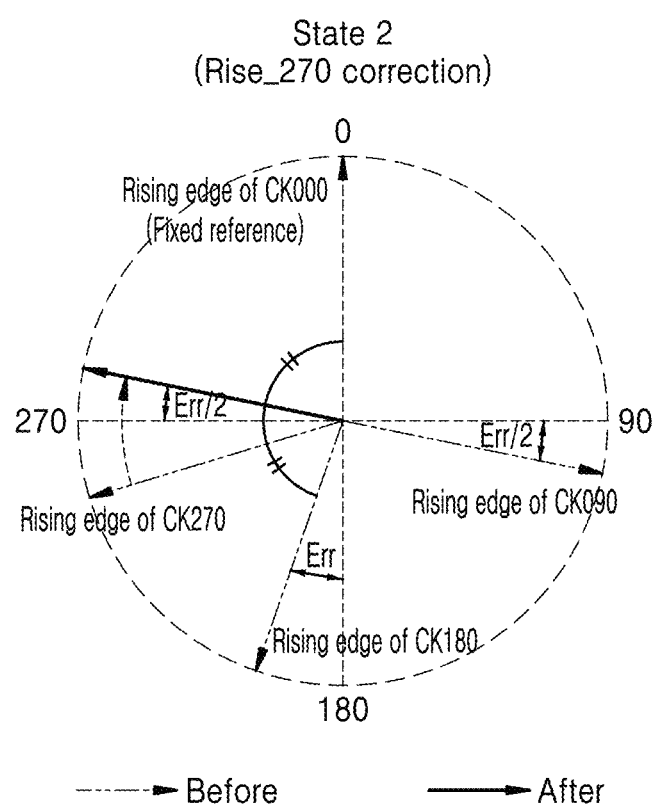
FIG. 3C is a visual representation of the operation S302 of FIG. 3A.

FIG. 3C is a visual representation of operation S302 of FIG. 3A. FIG. 3C may be described with reference to FIGS. 3A and 3B.

Referring to FIG. 3C. STATE 2 represents an example of a correct rising edge of the fourth clock after STATE 1.

The clock edge correcting device 100 may correct the phase of the rising edge of the fourth clock to the second middle point of the rising edge of the first clock and the rising edge of the third clock. The first middle point and the second middle point may be 180 degrees out of phase. Accordingly, the error Err/2 411 may be based on a phase where the rising edge of the fourth clock is 270 degrees behind the phase of the rising edge of the first clock. For example, the rising edge of the fourth clock may be corrected so that the error is reduced compared to the rising edge of the third clock.

Figure 3D:
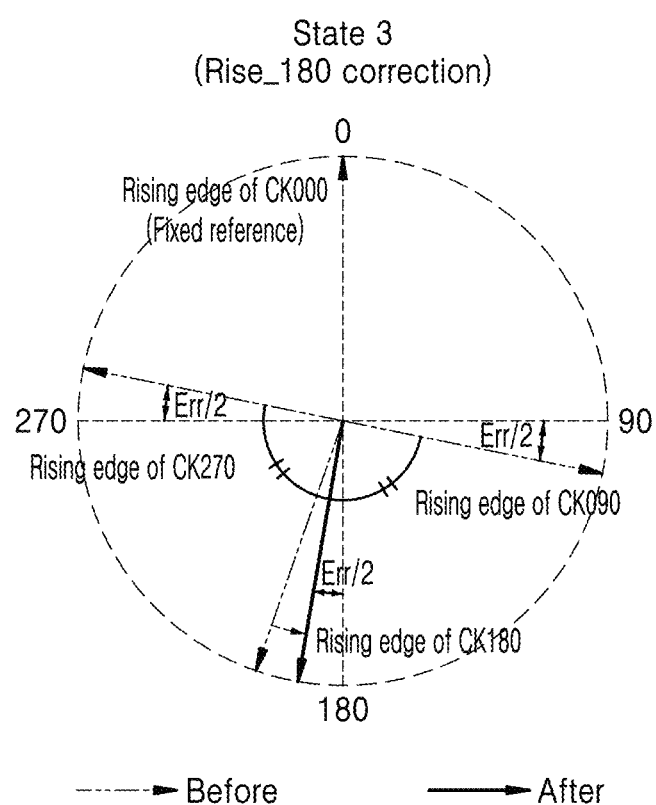
FIG. 3D is a visual representation of the operation S303 of FIG. 3A.

FIG. 3D is a visual representation of operation S303 of FIG. 3A. FIG. 3D may be described with reference to FIGS. 3A, 3B, and 3C.

Referring to FIG. 3D and FIG. 3C, STATE 3 represents an example of a correction of a rising edge of a third clock after STATE 1 and STATE 2.

The clock edge correcting device 100 may correct the phase of the rising edge of the fourth clock to the second middle point of the rising edge of the first clock and the rising edge of the third clock. Accordingly, an error Err/2 and 412 may be generated based on a phase in which the rising edge of the third clock is 180 degrees behind the phase of the rising edge of the first clock. For example, the rising edge of the third clock may be corrected so that the error is less than that of the rising edge of the third clock. An error of the rising edge of the third clock may be halved compared to the initial state. As the above-described clock edge correcting device 100 repeatedly operates operations S301, S302, and S303, the quadrature error of each clock may converge to zero in a steady-state. If this is expressed as a mathematical expression, the following Equation 1 is obtained.

$$\text{Error}_{steady\_state} = \lim_{n \to \infty} \frac{\text{Error}_{Initial\_state}}{2^n} \approx 0 \quad \text{[Equation 1]}$$

Figure 4:
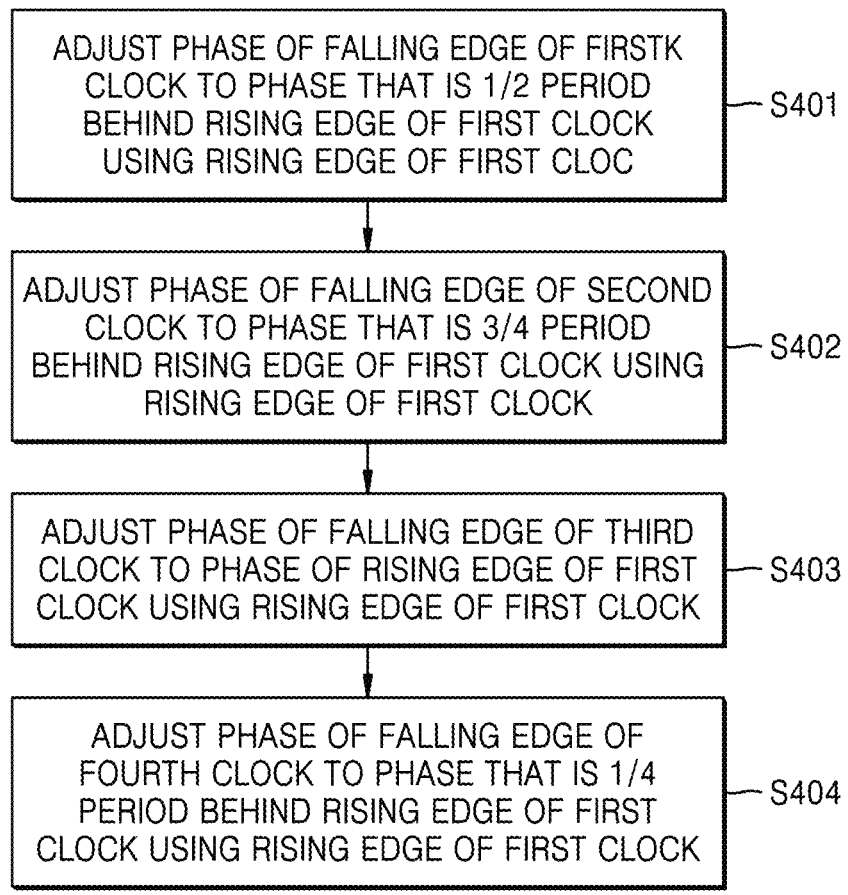
FIG. 4 is a flowchart of a clock edge correction method according to some example embodiments.

FIG. 4 is a flowchart of a clock edge correction method according to some example embodiments.

Referring to FIG. 4, in operation S401, the clock edge correcting device 100 may adjust the phase of the falling edge of the first clock to a phase that is ½ period behind the rising edge of the first clock using the rising edge of the first clock.

In operation S402, the clock edge correcting device 100 may adjust the phase of the falling edge of the second clock to a phase ¾ period behind the rising edge of the first clock using the rising edge of the first clock.

In operation S403, the clock edge correcting device 100 may adjust the phase of the falling edge of the third clock to the phase of the rising edge of the first clock using the rising edge of the first clock.

In operation S404, the clock edge correcting device 100 may adjust the phase of the falling edge of the fourth clock to a phase ¼ period behind the rising edge of the first clock using the rising edge of the first clock.

Figure 5A:
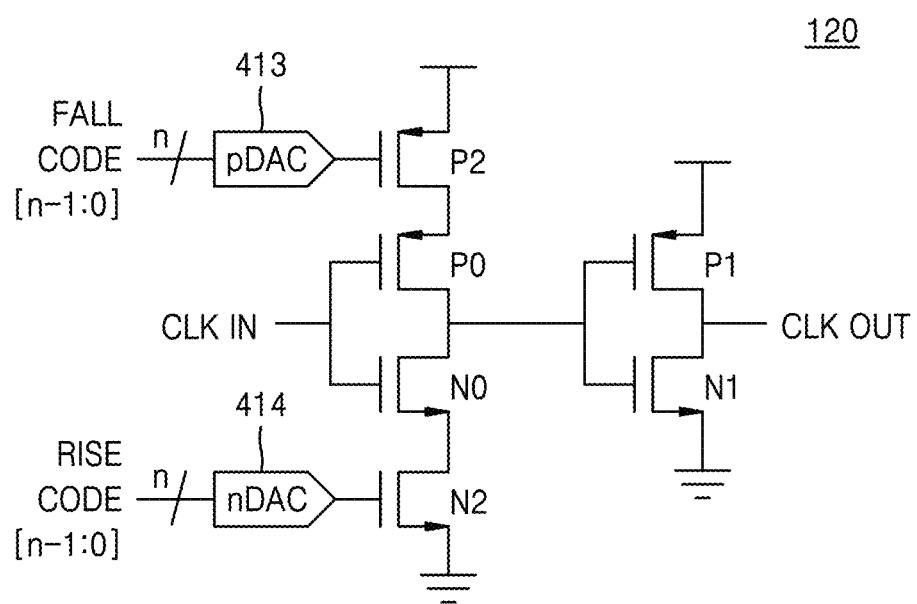
FIG. 5A shows a circuit diagram of an edge corrector according to some example embodiments.

FIG. 5A shows a circuit diagram of an edge corrector according to some example embodiments. FIG. 5A may be described with reference to FIGS. 2B and 2C.

Referring to FIG. 5A, the edge corrector 120 may include a p-type digital to analog converter (pDAC) 413, an n-type digital to analog converter (nDAC) 414, a plurality of PMOS transistors P0, P1, and P2, and a plurality of NMOS transistors. N0, N1, and N2.

Physical characteristics such as but not limited to at least one of gate lengths, gate widths, and oxide thicknesses of each of the plurality of PMOS transistors P0, P1, and P2 may be the same as each other, or at least one may be different from others. Alternatively or additionally, physical characteristics such as but not limited to at least one of gate lengths, gate widths, and oxide thicknesses of each of the plurality of NMOS transistors N0, N1, and N2 may be the same as each other, or at least one may be different from others. Alternatively or additionally, electrical characteristics such as but not limited to at least one of threshold voltages and drive currents of each of the plurality of PMOS transistors P0, P1, and P2 may be the same as each other, or at least one may be different from others. Alternatively or additionally, electrical characteristics such as but not limited to at least one of threshold voltages and drive currents of each of the plurality of NMOS transistors N0, N1, and N2 may be the same as each other, or at least one may be different from others.

The edge corrector 120 may receive an n-bit code from the accumulator 160 of FIG. 2B or the accumulators 161, 162, 163, and 164 of FIG. 2C to the input terminal of the pDAC 413.

The edge corrector 120 may receive an n-bit code from the accumulator 150 of FIG. 2B or the accumulators 151, 152, 153, and 154 of FIG. 2C to the input terminal of the nDAC 49.

The edge corrector 120 may receive a first clock, a second clock, a third clock, and a fourth clock from the gate terminal of the PMOS transistor P0 and the gate terminal of the NMOS transistor N0.

The edge corrector 120 may output a first clock, a second clock, a third clock, and a fourth clock based on the correction at the drain terminal of the PMOS transistor P1 and the drain terminal of the NMOS transistor N1.

Figure 5B:
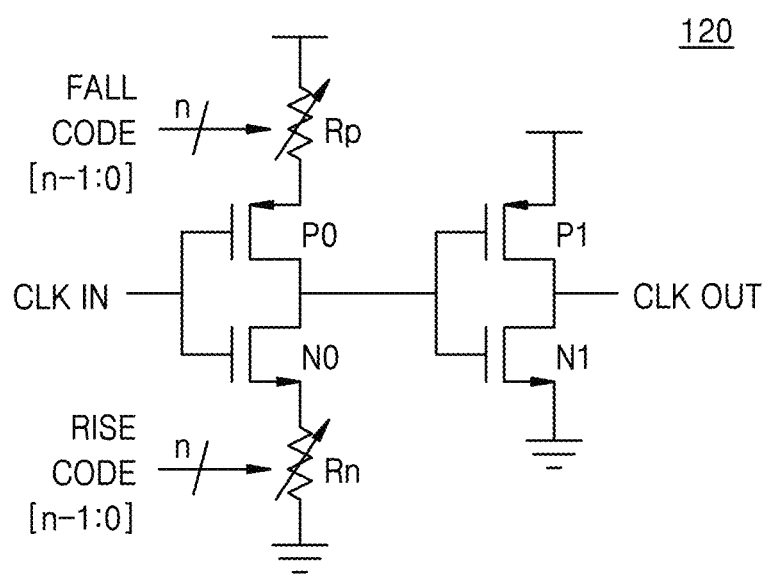
FIG. 5B shows a circuit diagram of an edge corrector according to some example embodiments.

FIG. 5B shows a circuit diagram of an edge corrector according to some example embodiments. FIG. 5A may be described with reference to FIGS. 2B and 2C.

Referring to FIG. 5B, the edge corrector 120 may include a plurality of PMOS transistors P0 and P1, a plurality of NMOS transistors N0 and N1, and variable resistors Rp and Rn.

The edge corrector 120 may adjust the resistance value of the variable resistor Rp based on the n-bit code received from the accumulator 160 of FIG. 2B or the accumulators 161, 162, 163, and 164 of FIG. 2C.

The edge corrector 120 may adjust the resistance value of the variable resistor Rn based on the n-bit code received from the accumulator 150 of FIG. 2B or the accumulators 151, 152, 153, and 154 of FIG. 2C.

The edge corrector 120 may receive a first clock, a second clock, a third clock, and a fourth clock from the gate terminal of the PMOS transistor P0 and the gate terminal of the NMOS transistor N0.

The edge corrector 120 may output a first clock, a second clock, a third clock, and a fourth clock based on the correction at the drain terminal of the PMOS transistor P1 and the drain terminal of the NMOS transistor N1.

Figure 6A:
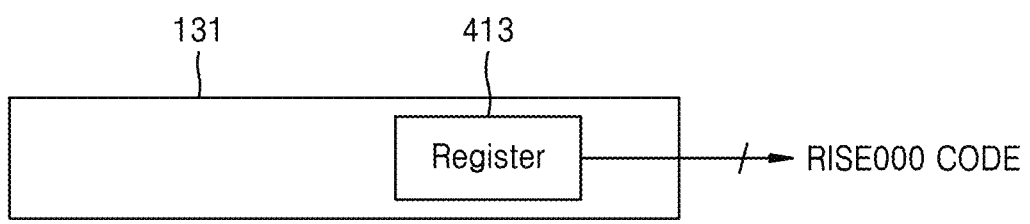
FIG. 6A illustrates a first rising edge error detector according to some example embodiments.
Figure 6B:
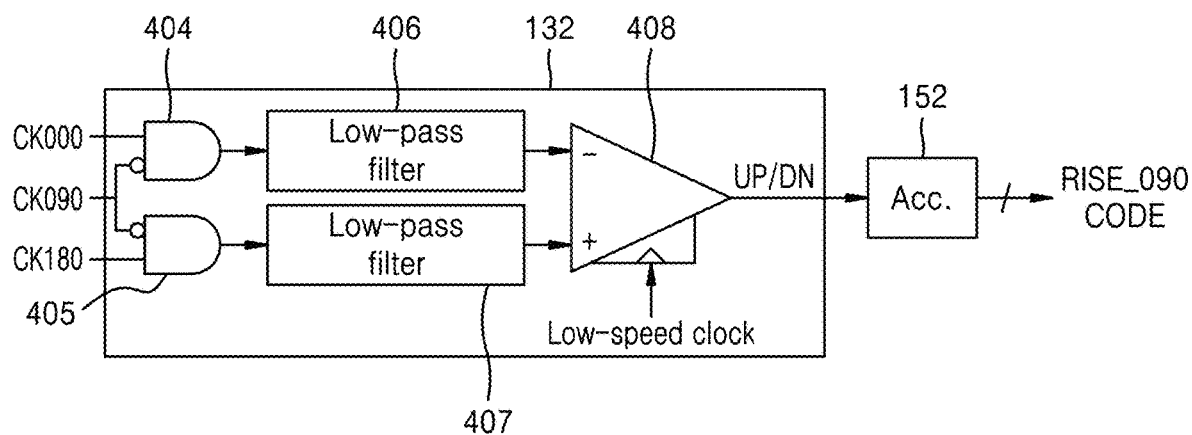
FIG. 6B illustrates a second rising edge error detector according to some example embodiments.
Figure 6C:
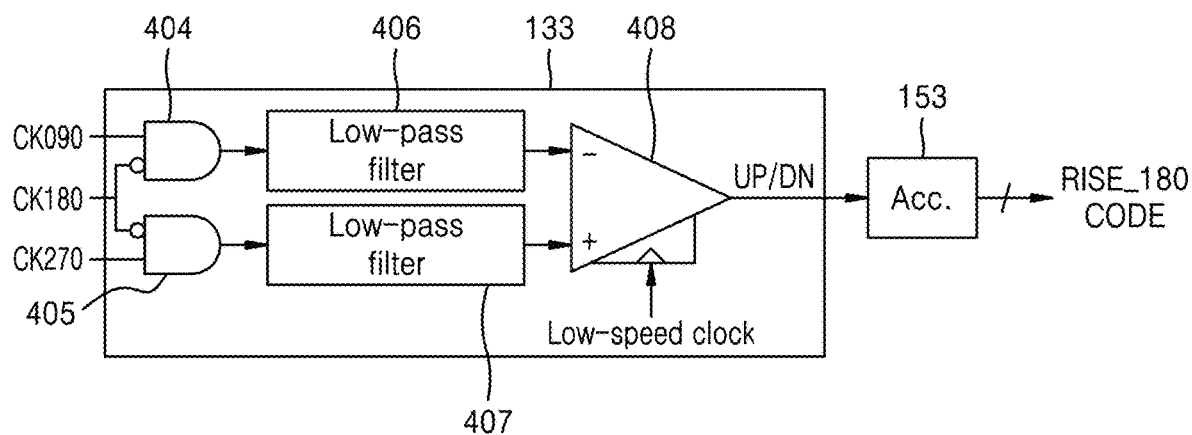
FIG. 6C illustrates a third rising edge error detector according to some example embodiments.
Figure 6D:
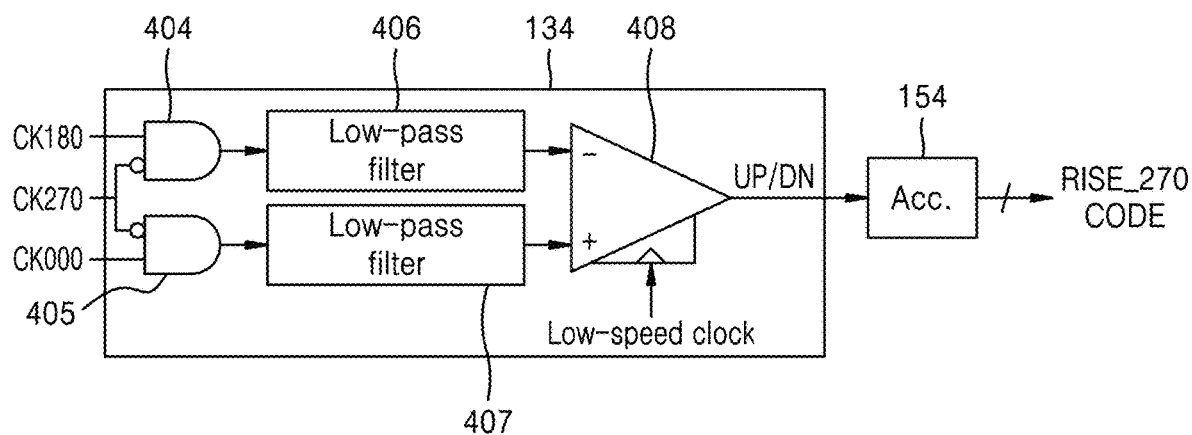
FIG. 6D illustrates a fourth rising edge error detector according to some example embodiments.

FIG. 6A illustrates a first rising edge error detector according to some example embodiments. FIG. 6B illustrates a second rising edge error detector according to some example embodiments. FIG. 6C illustrates a third rising edge error detector according to some example embodiments. FIG. 6D illustrates a fourth rising edge error detector according to some example embodiments. FIGS. 6A, 6B, 6C, and 6D may be described with reference to FIG. 2C.

Referring to FIG. 6A, the first rising edge error detector 131 may include a register 410. The register 410 may be a memory and/or a flip-flop and/or a plurality of flip-flops. The register 410 may fix the rising edge of the first clock to one code.

Referring to FIG. 6B, the second rising edge error detector 132 may include AND gates 404 and 405, low-pass filters 406 and 407, and a comparator 408. The second rising edge error detector 132 may generate a pulse corresponding to a section between the rising edge of the first clock and the rising edge of the second clock, and a pulse corresponding to a section between the rising edge of the second clock and the rising edge of the third clock through AND gates 404 and 405. The second rising edge error detector 132 may extract a DC value by passing the pulses through the low pass filters 406 and 407, respectively. The second rising edge error detector 132 may obtain a signal such as a 1-bit UP/DOWN signal indicating whether the rising edge of the first clock is ahead of or behind the ideal position through the comparator 408. When the accumulator 152 accumulates the 1-bit UP/DOWN signals, the RISE_090 code may instruct the rising edge of the second clock to converge to an ideal position.

Referring to FIG. 6C, the third rising edge error detector 133 may include AND gates 404 and 405, low-pass filters 406 and 407, and a comparator 408. The third rising edge error detector 133 may generate a pulse corresponding to a section between a rising edge of the second clock and a rising edge of the third clock and a pulse corresponding to a section between the rising edge of the third clock and the rising edge of the fourth clock through the AND gates 404 and 405. The third rising edge error detector 133 may extract a DC value by passing the pulses through the low pass filters 406 and 407, respectively. The third rising edge error detector 133 may obtain a signal such as a 1-bit UP/DOWN signal indicating whether the rising edge of the third clock is ahead of or behind the ideal position through the comparator 408. When the accumulator 153 accumulates the 1-bit UP/DOWN signals, the RISE_180 code may instruct the rising edge of the second clock to converge to an ideal position.

Referring to FIG. 6D, the fourth rising edge error detector 134 may include AND gates 404 and 405, low-pass filters 406 and 407, and a comparator 408. The fourth rising edge error detector 134 may generate a pulse corresponding to a section between the rising edge of the third clock and the rising edge of the fourth clock and a pulse corresponding to a section between the rising edge of the fourth clock and the rising edge of the first clock through the AND gates 404 and 405. The fourth rising edge error detector 134 may extract a DC value by passing the pulses through the low pass filters 406 and 407, respectively. The fourth rising edge error detector 134 may obtain a signal such as a 1-bit UP/DOWN signal indicating whether the rising edge of the third clock is ahead of or behind the ideal position through the comparator 408. When the accumulator 154 accumulates the 1-bit UP/DOWN signals, the RISE_270 code may instruct the rising edge of the second clock to converge to an ideal position.

Figure 7A:
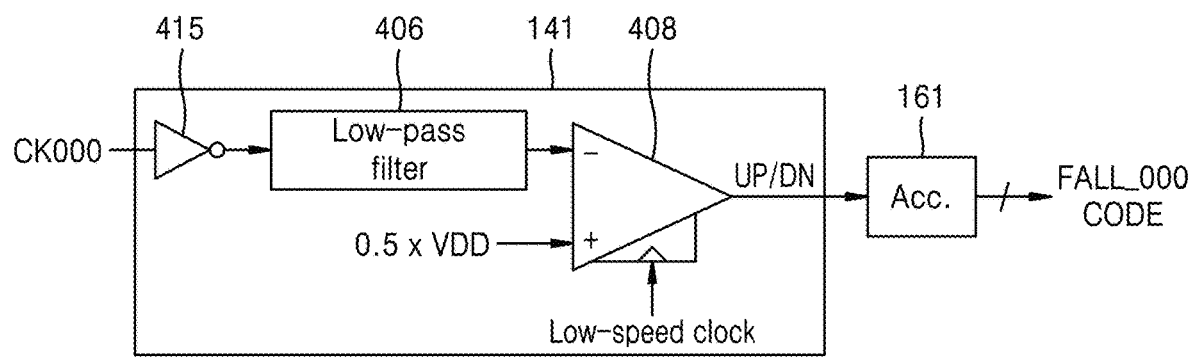
FIG. 7A illustrates a first falling edge error detector according to some example embodiments.
Figure 7B:
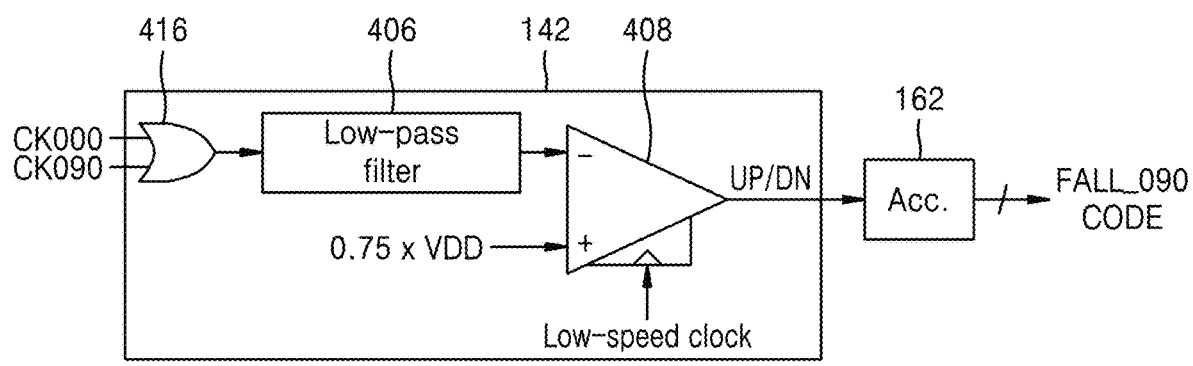
FIG. 7B illustrates a second falling edge error detector according to some example embodiments.
Figure 7C:
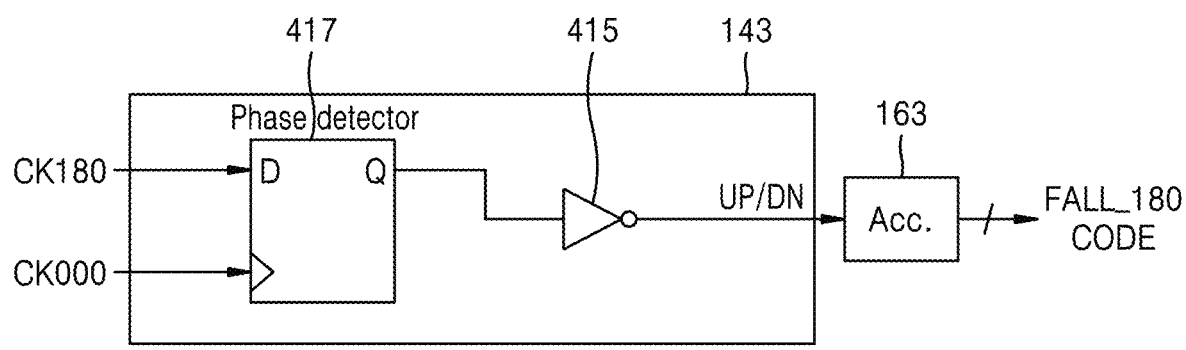
FIG. 7C illustrates a third falling edge error detector according to some example embodiments.
Figure 7D:
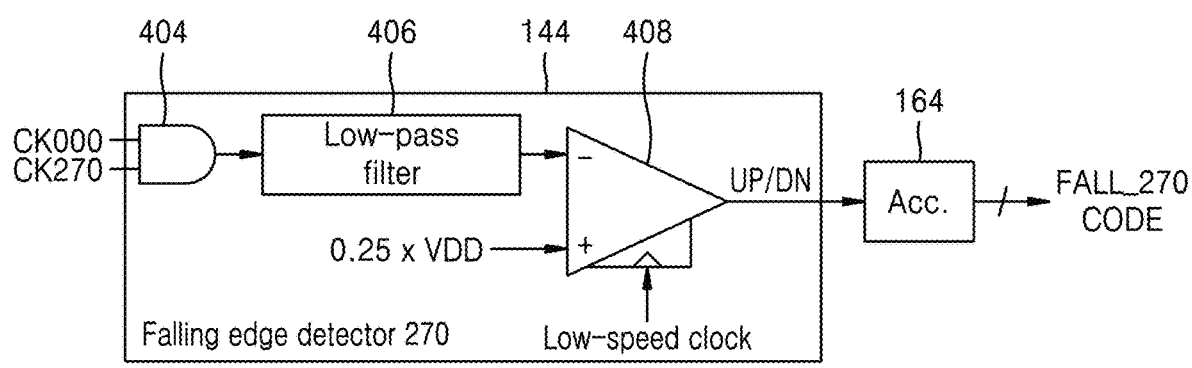
FIG. 7D illustrates a fourth falling edge error detector according to some example embodiments.

FIG. 7A illustrates a first falling edge error detector according to some example embodiments. FIG. 7B illustrates a second falling edge error detector according to some example embodiments. FIG. 7C illustrates a third falling edge error detector according to some example embodiments. FIG. 7D illustrates a fourth falling edge error detector according to some example embodiments. FIGS. 7A, 7B, 7C, and 7D may be described with reference to FIG. 2C.

Referring to FIG. 7A, the first falling edge error detector 141 may include an inverter 415, a low pass filter 406, and a comparator 408. The first falling edge error detector 141 may receive the first clock through the inverter 415. The first falling edge error detector 141 may obtain a DC value by passing the first clock through the low pass filter 406. For example, the first falling edge error detector 141 may obtain a DC value by passing the inverted first clock through the low pass filter 406. The first falling edge error detector 141 may compare the DC value to 0.5*VDD through the comparator 408. The first falling edge error detector 141 may obtain a signal such as a 1-bit UP/DOWN signal indicating whether the falling edge of the first clock is ahead or behind the ideal position through the comparator 408. When the accumulator 161 accumulates the 1-bit UP/DOWN signals, the FALL_000 code may instruct the falling edge of the first clock to converge to an ideal position.

Referring to FIG. 7B, the second falling edge error detector 142 may include an OR gate 416, a low pass filter 406, and a comparator 408. The second falling edge error detector 142 may perform OR gating on the first clock and the second clock through an OR gate 416. Accordingly, the second falling edge error detector 142 may obtain pulses generated by the rising edge of the first clock and the falling edge of the second clock. The second falling edge error detector 142 may obtain a DC value by performing low pass filtering on the obtained pulse. The second falling edge error detector 142 may compare the DC value to 0.75 VDD through the comparator 408. The second falling edge error detector 142 may obtain a 1-bit UP/DOWN signal indicating whether the falling edge of the second clock is ahead or behind the ideal position through the comparator 408. When the accumulator 162 accumulates the 1-bit UP/DOWN signals, the FALL_090 code may instruct the falling edge of the second clock to converge to an ideal position.

Referring to FIG. 7C, the third falling edge error detector 143 may include a phase detector 417 and an inverter 415. The phase detector 417 may be a positive edge triggered D-flipflop. The third falling edge error detector 143 may obtain a 1-bit UP/DOWN signal indicating whether the falling edge of the third clock is ahead or behind the ideal position through the inverter 415 and the phase detector 417. When the accumulator 163 accumulates the 1-bit UP/DOWN signals, the FALL_180 code may instruct the falling edge of the third clock to converge to an ideal position. In some example embodiments, the third falling edge error detector 143 increases the falling edge code of the third clock when the third clock is 0 at the rising edge of the first clock using the phase detector 417, and may decrease the falling edge code of the third clock when the third clock is 1 at the rising edge of the first clock. Accordingly, the third falling edge error detector may cause the rising edge of the first clock and the falling edge of the third clock to converge to the same phase.

Referring to FIG. 7D, the fourth falling edge error detector 144 may include an AND gate 404, a low pass filter 406, and a comparator 408. The fourth falling edge error detector 144 may perform AND gating on the first clock and the fourth clock through the AND gate 404. Accordingly, the fourth falling edge error detector 144 may obtain a pulse generated by the rising edge of the first clock and the falling edge of the fourth clock. The fourth falling edge error detector 144 may obtain a DC value by performing low pass filtering on the obtained pulse. The fourth falling edge error detector 144 may compare the DC value to 0.25 VDD through the comparator 408. The fourth falling edge error detector 144 may obtain a signal such as a 1-bit UP/DOWN signal indicating whether the falling edge of the fourth clock is ahead or behind the ideal position through the comparator 408. When the accumulator 164 accumulates the 1-bit UP/DOWN signals, the FALL_270 code may instruct the falling edge of the third clock to converge to an ideal position.

Figure 8:
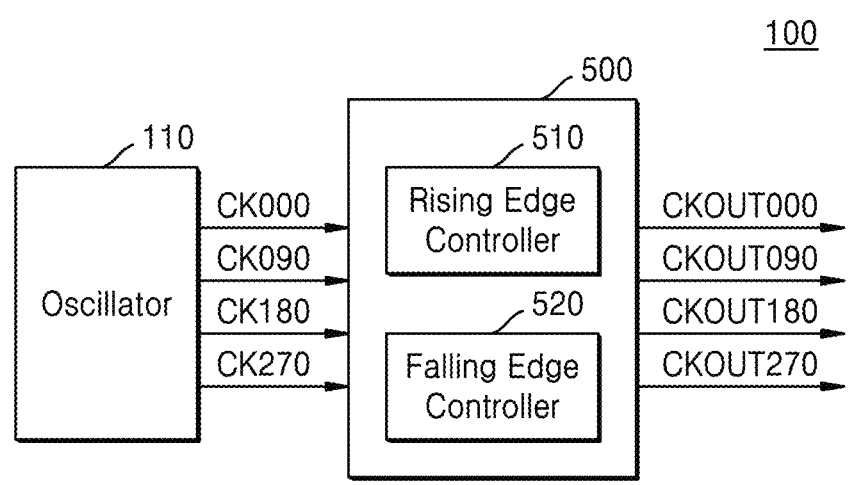
FIG. 8 illustrates a clock edge correcting device according to some example embodiments.

FIG. 8 illustrates a clock edge correcting device according to some example embodiments. FIG. 8 may be described with reference to FIG. 2A.

Referring to FIG. 8, the clock edge correcting device 100 may include an oscillator 110 and a clock edge controller 500. The clock edge controller 500 may include a rising edge controller 510 and a falling edge controller 520.

According to some example embodiments, the rising edge controller 510 may include a rising edge error detector 130 and a rising edge corrector for correcting the rising edge. The falling edge controller 520 may include a falling edge error detector 140 and a falling edge corrector that corrects the falling edge.

The clock edge correcting device 100 according to some example embodiments may receive a first clock, a second clock, a third clock, and a fourth clock. The clock edge correcting device 100 may adjust a second rising edge of the second clock based on a first rising edge of the first clock and a third rising edge of the third clock. After adjusting the phase of the second rising edge, the clock edge correcting device 100 may adjust the phase of the fourth rising edge of the fourth clock based on the first rising edge and the third rising edge. After adjusting the phase of the fourth rising edge, the clock edge correcting device 100 may adjust the phase of the third rising edge based on the adjusted second rising edge and the adjusted fourth rising edge. The clock edge correcting device 100 may adjust a phase of a first falling edge of the first clock based on the first rising edge.

The clock edge correcting device 100 may adjust a phase of a second falling edge of the second clock based on the first rising edge. The clock edge correcting device 100 may adjust a phase of a third falling edge of the third clock based on the first rising edge. The clock edge correcting device 100 may adjust a phase of a fourth falling edge of the fourth clock based on the first rising edge. The clock edge correcting device 100 may transmit the adjusted first clock, the adjusted second clock, the adjusted third clock, and the adjusted fourth clock.

Figure 9:
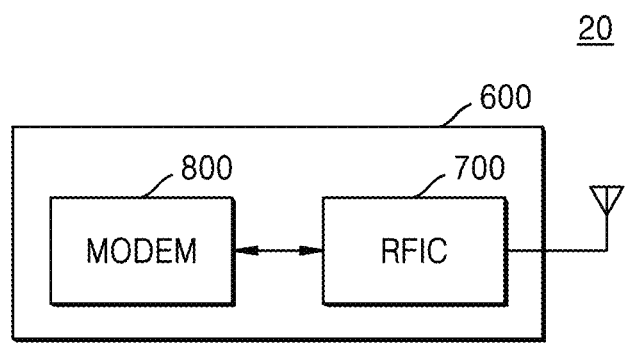
FIG. 9 illustrates a system for transmitting and receiving data according to some example embodiments.

FIG. 9 illustrates a data transmission/reception system according to some example embodiments. FIG. 9 may be described with reference to FIG. 1.

Referring to FIG. 9, a data transmission/reception system 600 may include a radio-frequency integrated circuit (RFIC) 700 and a modem 800.

The RFIC 700 may include the transmitter 10 including the clock edge correcting device 100 according to various example embodiments.

The modem 800 may include the transmitter 10 including the clock edge correcting device 100 according to various example embodiments.

The RFIC 700 and the modem 800 may exchange data with each other using the clock edge correction method according to various example embodiments.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While inventive concepts have been particularly shown and described with reference to some example embodiments thereof, it will be understood that various changes in form and details may be made therein without departing from the spirit and scope of the following claims. Example embodiments are not necessarily mutually exclusive. For example, some example embodiments may include one or more features described with reference to one or more figures, and may also include one or more other features described with reference to one or more other figures

What is claimed is:

1. A method of correcting a clock, the method comprising:
    receiving a first clock, a second clock, a third clock, and a fourth clock;
    detecting an error of each of a second rising edge of the second clock, a third rising edge of the third clock, and a fourth rising edge of the fourth clock, each of the detecting based on a first rising edge of the first clock;
    correcting each of the second rising edge, the third rising edge, and the fourth rising edge based on a respective error of each of the second rising edge, the third rising edge, and the fourth rising edge;
    detecting an error of each of a first falling edge of the first clock, a second falling edge of the second clock, a third falling edge of the third clock, and a fourth falling edge of the fourth clock, the detecting based on the first rising edge;
    correcting each of the first falling edge, the second falling edge, the third falling edge, and the fourth falling edge based on a respective error of each of the first falling edge, the second falling edge, the third falling edge, and the fourth falling edge; and
    transmitting the first clock based on the correction of the first falling edge, the second clock based on the correction of the second rising edge and the second falling edge, the third clock based on the correction of the third rising edge and the third falling edge, and the fourth clock based on the correction of the fourth rising edge and the fourth falling edge,
    wherein the first clock based on the correction of the first falling edge, the second clock based on the correction of the second rising edge and the second falling edge, the third clock based on the correction of the third rising edge and the third falling edge, and the fourth clock based on the correction of the fourth rising edge and the fourth falling edge are quadrature with each other.

2. The method of claim 1, wherein
    the detecting of the error for the rising edges comprises detecting a first phase difference between a phase of the second rising edge and a first phase, a second phase difference between a phase of the third rising edge and a second phase, and a third phase difference between a phase of the fourth rising edge and a third phase, and
    the first phase is 90 degrees behind a phase of the first rising edge, the second phase is 180 degrees behind the phase of the first rising edge, and the third phase is 270 degrees behind the phase of the first rising edge.

3. The method of claim 2, wherein the detecting of the error for the rising edges comprises:
    a first adjustment operation of adjusting the phase of the second rising edge to a first middle point between the phase of the first rising edge and the phase of the third rising edge;
    a second adjustment operation of adjusting a phase of the fourth rising edge to a second middle point between the phase of the first rising edge and the phase of the third rising edge;
    a third adjustment operation of adjusting the phase of the third rising edge to a middle point between the adjusted phase of the second rising edge and the adjusted phase of the fourth rising edge; and
    an operation of repeating the first adjustment operation, the second adjustment operation, and the third adjustment operation,
    wherein the first phase difference, the second phase difference and the third phase difference are detected based on the repetition.

4. The method of claim 3, wherein, as the first adjustment operation, the second adjustment operation, and the third adjustment operation are repeated, a fourth phase difference between the phase of the adjusted second rising edge and the first phase, a fifth phase difference between the phase of the adjusted third rising edge and the second phase, and a sixth phase difference between the phase of the adjusted fourth rising edge and the third phase decrease.

5. The method of claim 2, wherein the first phase difference, the second phase difference, and the third phase difference correspond to digital codes obtained from the first clock, the second clock, the third clock, and the fourth clock by using a NOT gate, a NAND gate, a comparator, and an accumulator.

6. The method of claim 2, wherein the correcting of each of the second rising edge, the third rising edge, and the fourth rising edge comprises:
    correcting the phase of the second rising edge to be 90 degrees behind the phase of the first rising edge, based on the first phase difference;
    correcting the phase of the third rising edge to be 180 degrees behind the phase of the first rising edge, based on the second phase difference; and
    correcting the phase of the fourth rising edge to be 270 degrees behind the phase of the first rising edge, based on the third phase difference.

7. The method of claim 1, wherein
    the detecting of the error on the falling edges comprises detecting a seventh phase difference between a phase of the first falling edge and a second phase, an eighth phase difference between a phase of the second falling edge and a third phase, a ninth phase difference between a phase of the third falling edge and a phase of the first rising edge, and a tenth phase difference between a phase of the fourth falling edge and the first phase,
    wherein the first phase is 90 degrees behind the phase of the first rising edge, the second phase is 180 degrees behind the phase of the first rising edge, and the third phase is 270 degrees behind the phase of the first rising edge.

8. The method of claim 7, wherein the detecting of the error on the falling edges comprises:
    a first adjustment operation of adjusting a phase of the fourth falling edge to a first middle point between the phase of the first rising edge and the phase of the first falling edge;
    a second adjustment operation of adjusting the phase of the second falling edge to a second middle point between the phase of the first rising edge and the phase of the first falling edge;
    a third adjustment operation of adjusting the phase of the first falling edge to a middle point between the phase of the adjusted fourth falling edge and the phase of the adjusted second falling edge;
repeating the first adjustment operation, the second adjustment operation and the third adjustment operation; and
detecting the ninth phase difference using a phase detector,
wherein the seventh phase difference, the eighth phase difference, and the tenth phase difference are detected based on the repeating.

9. The method of claim 7, wherein the correcting of each of the first falling edge, the second falling edge, the third falling edge, and the fourth falling edge comprises correcting the phase of the first falling edge to be 180 degrees behind the phase of the first rising edge based on the seventh phase difference, correcting the phase of the second falling edge to be 270 degrees behind the phase of the first rising edge based on the eighth phase difference, correcting the phase of the third falling edge to the phase of the first rising edge based on the ninth phase difference, and correcting the phase of the fourth falling edge to be 90 degrees behind the phase of the first rising edge based on the tenth phase difference.

10. The method of claim 1, wherein correcting each of the second rising edge, the third rising edge, and the fourth rising edge and correcting each of the first falling edge, the second falling edge, the third falling edge, and the fourth falling edge are independent of each other.

11. The method of claim 1, wherein a duty-cycle of each of the first clock based on the correcting, the second clock based on the correcting, the third clock based on the correcting, and the fourth clock based on the correcting is 50%.

12. A method of correcting a clock, the method comprising:
receiving a first clock, a second clock, a third clock, and a fourth clock;
adjusting a phase of a second rising edge of the second clock based on a first rising edge of the first clock and on a third rising edge of the third clock;
adjusting a phase of a fourth rising edge of the fourth clock based on the first rising edge and on the third rising edge after adjusting the phase of the second rising edge;
adjusting a phase of the third rising edge based on the adjusted second rising edge and on the adjusted fourth rising edge after the phase adjustment of the fourth rising edge;
adjusting a phase of a first falling edge of the first clock based on the first rising edge;
adjusting a phase of a second falling edge of the second clock based on the first rising edge;
adjusting a phase of a third falling edge of the third clock based on the first rising edge;
adjusting a phase of a fourth falling edge of the fourth clock based on the first rising edge; and
transmitting the adjusted first clock, the adjusted second clock, the adjusted third clock, and the adjusted fourth clock,
wherein the adjusted first clock, the adjusted second clock, the adjusted third clock, and the adjusted fourth clock are quadrature with each other.

13. The method of claim 12, wherein
the phase adjustment of the second rising edge includes positioning the phase of the second rising edge at a middle point of the phase of the first rising edge and the phase of the third rising edge,
the phase adjustment of the fourth rising edge includes positioning the phase of the fourth rising edge at the middle point of the phase of the first rising edge and the phase of the third rising edge, and
the phase adjustment of the third rising edge includes locating the phase of the third rising edge at a middle point of the adjusted phase of the second rising edge and the adjusted phase of the fourth rising edge.

14. The method of claim 13, further comprising:
repeating the adjusting of the phase of the second rising edge, the adjusting of the phase of the fourth rising edge, and the adjusting of the phase of the third rising edge,
wherein, based on the repeating, the phase of the second rising edge approaches 90 degrees behind the phase of the first rising edge, the phase of the third rising edge approaches 180 degrees behind the phase of the first rising edge, and the phase of the fourth rising edge approaches 270 degrees behind the phase of the first rising edge.

15. The method of claim 12, wherein
the phase adjustment of the first falling edge adjusts the phase of the first falling edge to lag behind the phase of the first rising edge by ½ of a period,
the phase adjustment of the second falling edge adjusts the phase of the second falling edge to be ¾ of the period behind the phase of the first rising edge,
the phase adjustment of the third falling edge adjusts the phase of the third falling edge to be the same as the phase of the first rising edge, and
the phase adjustment of the fourth falling edge adjusts the phase of the fourth falling edge to lag behind the first rising edge by ¼ of the period.

16. A clock correction circuit comprising:
an edge corrector circuit configured to receive a first clock, a second clock, a third clock, and a fourth clock;
a rising edge error detector circuit configured to detect errors of a second rising edge of the second clock, a third rising edge of the third clock, and a fourth rising edge of the fourth clock, the detecting based on the first rising edge of the first clock; and
a falling edge error detector circuit configured to detect errors of each of the first falling edge of the first clock, the second falling edge of the second clock, the third falling edge of the third clock, and the fourth falling edge of the fourth clock, the detecting based on the first rising edge,
wherein the edge corrector circuit is configured to
correct each of the second rising edge, the third rising edge, and the fourth rising edge based on the error of each of a respective one of the second rising edge, the third rising edge, and the fourth rising edge,
correct each of the first falling edge, the second falling edge, the third falling edge, and the fourth falling edge based on a respective one of the error of each of the first falling edge, the second falling edge, the third falling edge, and the fourth falling edge, and
transmit the first clock based on the correction of the first falling edge, the second clock based on the correction of the second rising edge and the second falling edge, the third clock based on the correction of the third rising edge and the third falling edge, and the fourth clock based on the correction of the fourth rising edge and the fourth falling edge,
wherein the first clock based on the correction, the second clock based on the correction, the third clock based on the correction, and the fourth clock based on the correction are quadrature with each other.

17. The clock correction circuit of claim 16, wherein the rising edge error detector circuit is further configured to detect
   a first phase difference between a phase of the second rising edge and a first phase,
   a second phase difference between a phase of the third rising edge and a second phase, and
   a third phase difference between a phase of the fourth rising edge and a third phase,
   wherein the first phase is 90 degrees behind a phase of the first rising edge, the second phase is 180 degrees behind the phase of the first rising edge, and the third phase is 270 degrees behind the phase of the first rising edge.

18. The clock correction circuit of claim 17, wherein the rising edge error detector circuit is further configured to perform
   a first adjustment including adjusting the phase of the second rising edge to a first middle point between the phase of the first rising edge and the phase of the third rising edge;
   a second adjustment including adjusting a phase of the fourth rising edge to a second middle point between the phase of the first rising edge and the phase of the third rising edge;
   a third adjustment including adjusting the phase of the third rising edge to a middle point between the adjusted phase of the second rising edge and the adjusted phase of the fourth rising edge; and
   an operation of repeating the first adjustment, the second adjustment, and the third adjustment,
   wherein the first phase difference, the second phase difference, and the third phase difference are detected based on the operation of repeating.

19. The clock correction circuit of claim 18, wherein, as the first adjustment, the second adjustment, and the third adjustment are repeated, a fourth phase difference between the phase of the adjusted second rising edge and the first phase, a fifth phase difference between the phase of the adjusted third rising edge and the second phase, and a sixth phase difference between the phase of the adjusted fourth rising edge and the third phase decrease.

20. The clock correction circuit of claim 17, wherein
   the rising edge error detector circuit comprises at least one of a NOT gate, a NAND gate, a comparator, and an accumulator, and
   the first phase difference, the second phase difference, and the third phase difference are digital codes obtained from the first clock, the second clock, the third clock, and the fourth clock using the NOT gate, the NAND gate, the comparator, and the accumulator.

* * * * *